US009230765B2

(12) United States Patent
Baran et al.

(10) Patent No.: US 9,230,765 B2

(45) Date of Patent: Jan. 5, 2016

(54) MODULAR OVERLOAD RELAY ASSEMBLY WITH MECHANICALLY ISOLATED CONNECTOR

(71) Applicants: Michael Baran, Milwaukee, WI (US); William Siebert, West Bend, MI (US)

(72) Inventors: Michael Baran, Milwaukee, WI (US); William Siebert, West Bend, MI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 91 days.

(21) Appl. No.: 13/667,919

(22) Filed: Nov. 2, 2012

(65) Prior Publication Data

US 2014/0126158 A1 May 8, 2014

(51) Int. Cl.

| | |
|---|---|
| ***H05K 7/02*** | (2006.01) |
| ***H01H 71/08*** | (2006.01) |
| ***H01H 89/00*** | (2006.01) |
| ***H01R 9/24*** | (2006.01) |
| *H01R 13/629* | (2006.01) |
| *H01R 12/79* | (2011.01) |

(52) U.S. Cl.

CPC ............... *H01H 71/08* (2013.01); *H01H 89/00* (2013.01); *H01R 9/2458* (2013.01); *H01R 12/79* (2013.01); *H01R 13/62905* (2013.01)

(58) Field of Classification Search

CPC ................................ H05K 7/02; H01R 13/627

USPC ................. 361/724–727, 728–747, 752–759, 361/796–837; 439/350, 300–330, 331–349; 248/309.1, 316.8, 917, 922, 923, 346.4

See application file for complete search history.

(56) References Cited

U.S. PATENT DOCUMENTS 4,683,515 A * 7/1987 Beihoff et al. ................ 361/106
4,791,361 A * 12/1988 Beihoff et al. ................ 324/126
5,198,793 A * 3/1993 Leveque ....................... 338/172
5,205,753 A 4/1993 Butterfield (Continued)

FOREIGN PATENT DOCUMENTS

DE 20 2007 010319 U1 5/1997
DE 20 2007010319 U1 10/2007

OTHER PUBLICATIONS

"Essential Components." Manual. Distributed by Rockwell Automation. 2012. pp. 1-48.

(Continued)

*Primary Examiner* — Courtney Smith
*Assistant Examiner* — Rashen E Morrison
(74) *Attorney, Agent, or Firm* — Quarles & Brady LLP

(57) ABSTRACT

A mating connector assembly for electrically coupling modular electrical devices. A first stationary connector is coupled to a first rigid circuit board positioned within a first housing of a first modular electrical device. The first floating connector is coupled to a flexible circuit element positioned within a second housing of a second modular electrical device, the flexible circuit element coupled to a circuit board positioned within a second housing of a second modular electrical device. The second housing includes a first latch plate adjustable between an unlatched position and a latched position, the first latch plate including a biasing member, such that, when the first modular electronic device is pressed together with the second modular electronic device, the biasing member applies a force to the first floating connector during a latch plate transition position to ensure that the first floating connector has fully mated with the first stationary connector.

19 Claims, 18 Drawing Sheets

(56) References Cited

U.S. PATENT DOCUMENTS

| | | | | |
|---|---|---|---|---|
| 5,510,759 | A * | 4/1996 | Gula et al. | 335/18 |
| 5,652,420 | A * | 7/1997 | Innes et al. | 200/50.32 |
| 5,793,270 | A * | 8/1998 | Beck et al. | 335/16 |
| 5,874,699 | A * | 2/1999 | Beck et al. | 200/244 |
| 5,904,592 | A * | 5/1999 | Baran et al. | 439/532 |
| 6,034,582 | A | 3/2000 | Fausch | |
| 6,034,584 | A * | 3/2000 | Hilfiker | 335/132 |
| 6,172,875 | B1 * | 1/2001 | Suzuki et al. | 361/729 |
| 6,232,855 | B1 * | 5/2001 | Malingowski et al. | 335/14 |
| 6,307,453 | B1 * | 10/2001 | Wellner et al. | 335/6 |
| 6,331,935 | B1 * | 12/2001 | Baran | 361/679.41 |
| 6,351,113 | B1 * | 2/2002 | Becker et al. | 324/117 H |
| 6,418,027 | B1 * | 7/2002 | Suzuki et al. | 361/729 |
| 6,472,621 | B2 | 10/2002 | Merlin et al. | |
| 6,545,234 | B1 * | 4/2003 | Trivette et al. | 200/50.21 |
| 6,617,533 | B1 * | 9/2003 | Lawson et al. | 200/50.32 |
| 6,661,671 | B1 * | 12/2003 | Franke et al. | 361/752 |
| 6,686,672 | B2 | 2/2004 | Brown et al. | |
| 6,770,829 | B1 * | 8/2004 | Hart | 200/314 |
| 7,064,951 | B2 * | 6/2006 | Barile et al. | 361/752 |
| 7,116,538 | B2 * | 10/2006 | Haensgen et al. | 361/93.1 |
| 7,609,528 | B2 * | 10/2009 | Freimuth et al. | 361/801 |
| 7,978,032 | B2 * | 7/2011 | Chen et al. | 335/15 |
| 8,054,612 | B2 * | 11/2011 | Ichinomiya et al. | 361/636 |
| 8,149,587 | B2 * | 4/2012 | Baran et al. | 361/788 |
| 2012/0158160 | A1 * | 6/2012 | Baran et al. | 700/83 |

OTHER PUBLICATIONS

"SmartWire-DT Panel Wiring Solutions." Manual. Distributed by Eaton Corporation. 2012. pp. 1-8.

Partial European Search Report, Sep. 18, 2014, App No. 13191403.8.

Extended European Search Report, Sep. 18, 2014, Reference EP91230RK900teg.

* cited by examiner

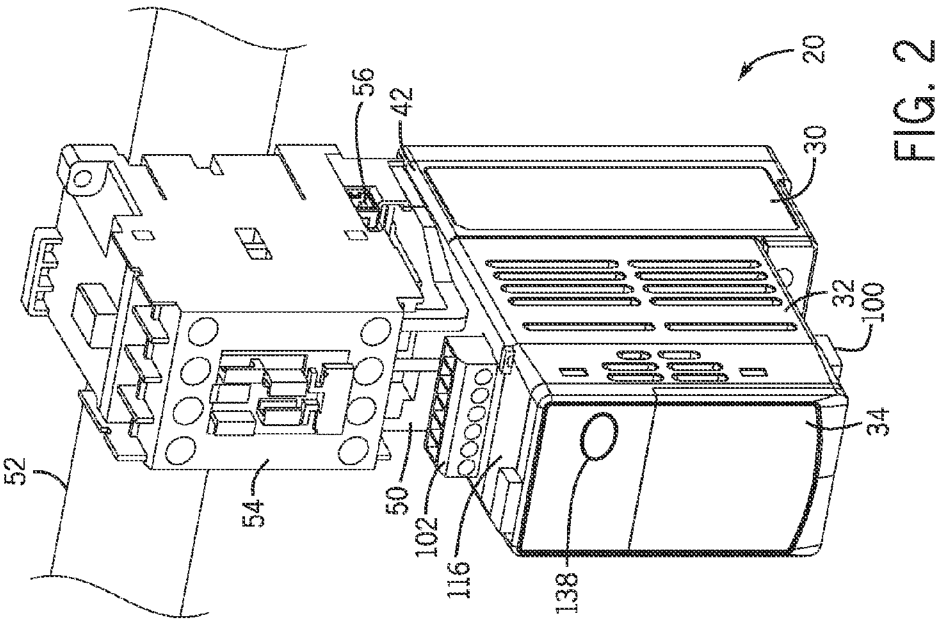
FIG. 2
FIG. 1
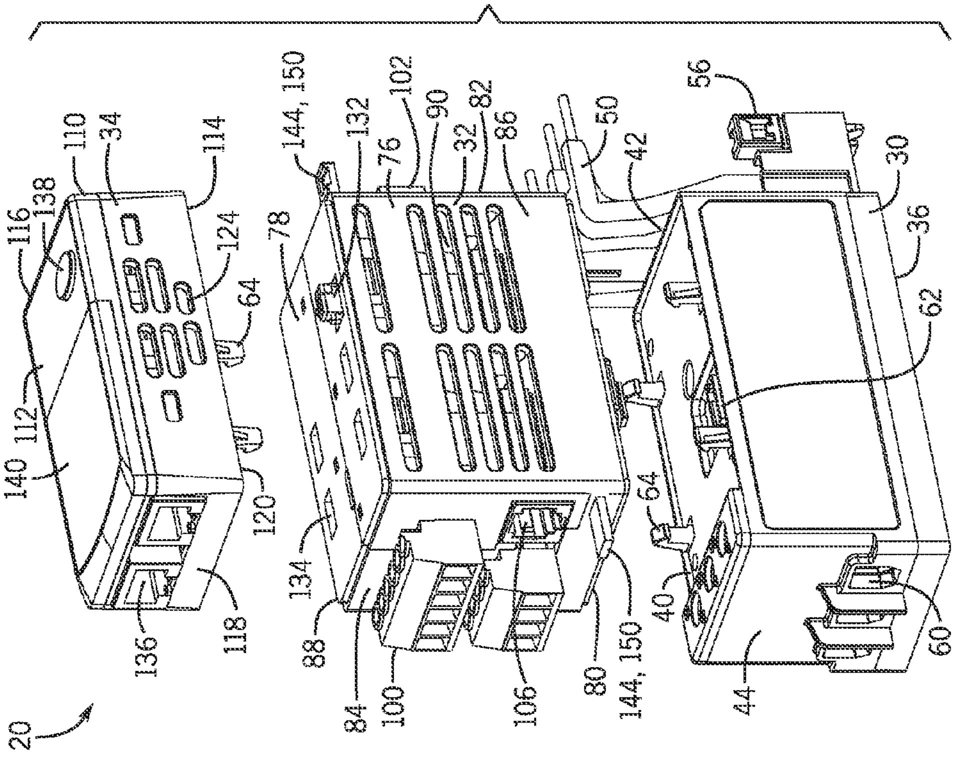

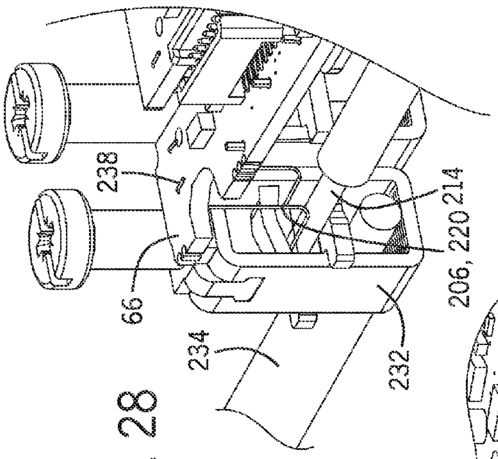
FIG. 28
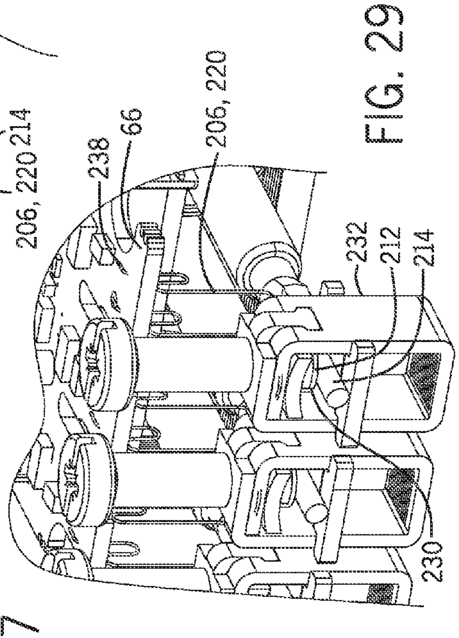
FIG. 29
FIG. 27
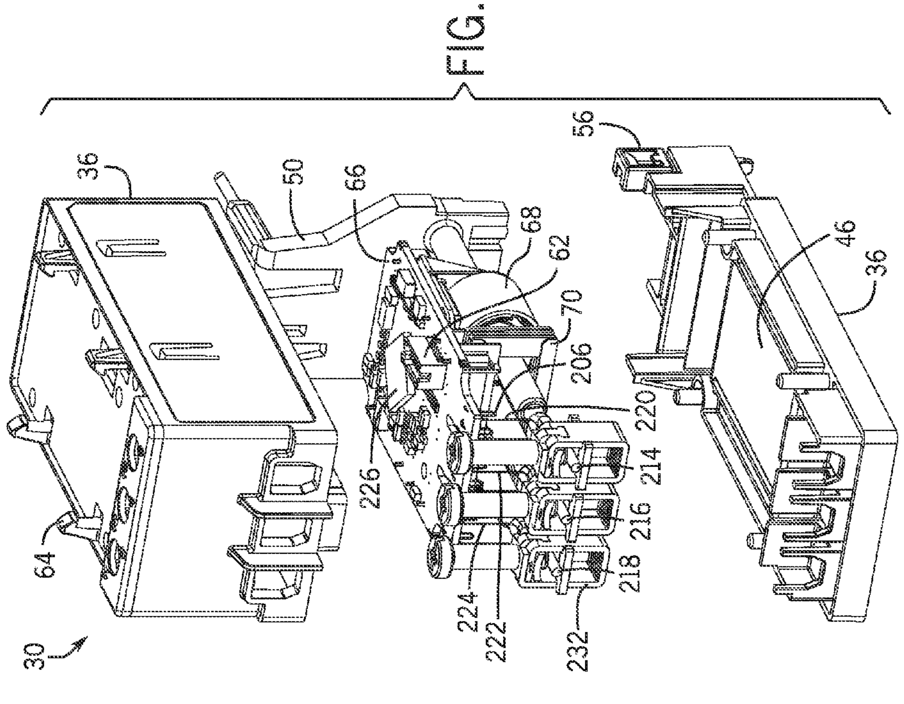

MODULAR OVERLOAD RELAY ASSEMBLY WITH MECHANICALLY ISOLATED CONNECTOR

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The subject matter disclosed herein relates generally to overload relays, and, more particularly, to a modular overload assembly adapted to couple to a contactor assembly.

Overload relays are current sensitive relays that can be used to disconnect power from equipment when an overload or other sensed condition exists. They are normally used in conjunction with an electromechanical contactor, and are designed to protect an electric motor or other electronic devices.

In a typical installation, the contactor provides three contacts, one associated with each of up to three phases of power, that are closed by an electromagnetically operated contactor coil. The overload relay includes current sensing elements that are wired in series with the three phases passing through the contactor to the motor. In this way, the overload relay can monitor current flowing in the three phases through the contactor, and based on current magnitude and duration, may interrupt the current flow through the contactor coil circuit to open the contactor contacts when an overload occurs. For this purpose, the overload relay includes a contact or contacts that can be used to control the contactor coil and/or provide a signal indicating an overload or other sensed condition.

One difficulty associated with overload relays in general is the large number of catalog numbers that need to be manufactured and warehoused. Typically, an overload relay is designed for only a small current range, and possibly a fixed set of functional options. If you are a manufacturer, you want to offer a full product line, which means offering a large variety of overload relays that operate at their respective currents. If you are an integrator or an OEM using overload relays, this mean that you need to have available a large selection of overload relays for your application's needs. Attempts to accommodate overload relays to operate in a wider range of applications results in increased size, cost, and heat generation.

When modular components are used, the modules requires reliable electronic interconnection between the modules. One primary problem is to minimize or eliminate electrical contact wear caused by relative mechanical motion between modules. When connection points are not visible for a user, this presents an extra burden on minimizing relative motion between modules. An overload relay which is directly mounted to an electromechanical contactor further exacerbates this burden by subjecting the device to millions of shock-like operations.

Still other difficulties associated with overload relays include a lack of built in voltage sensing capabilities. In order to sense voltage, an add on module is required that increases the width of the overload relay, increases cost, and requires further wiring to be completed by the user. In addition, control wiring needs to be completed by the user when the overload relay is wired to a contactor.

There is a need, therefore, for a modular overload relay assembly that can sense voltage and still allow a significant reduction in catalog numbers while still providing a large array of product combinations. There is also a need for an easy yet reliable configuration for a user to mechanically and electrically connect modules in the field and connect an overload relay to a contactor.

BRIEF DESCRIPTION OF THE INVENTION

The present embodiments overcomes the aforementioned problems by providing a modular overload relay assembly that can sense voltage and allow a significant reduction in catalog numbers while providing a large array of product combinations. The modular overload relay can provide an easy yet reliable configuration for a user to mechanically and electrically connect modules in the field and connect the overload relay to a contactor.

Accordingly, embodiments of the present invention include a system for electrically coupling modular electrical devices. The system comprises a first modular electronic device adapted to mechanically couple to a second modular electronic device, the first modular electronic device including a first housing and a first circuit board within the first housing, the first circuit board including a first electrical connector electrically coupled to the circuit board. The second modular electronic device includes a second housing and a second circuit board and a flexible circuit element within the second housing, the second circuit board electrically coupled to the flexible circuit element, the second housing including a latch plate adjustable between an unlatched position and a latched position, the latch plate including a biasing member. The flexible circuit element can be electrically coupled to a second electrical connector, the second electrical connector adapted to electrically mate with the first electrical connector. And, a connector carrier can be coupled to second electrical connector, the connector carrier including a cam, the cam adapted to engage the biasing member when the latch plate is adjusted between the unlatched position and the latched position, such that, when the first modular electronic device is pressed together with the second modular electronic device, the biasing member applies a force to the cam during a latch plate transition position to ensure that the second electrical connector has fully mated with the first electrical connector.

In accordance with another embodiment of the invention, embodiments of the present invention include a mating connector assembly for electrically coupling modular electrical devices. The assembly comprises a first stationary connector and a first floating connector. The first stationary connector can be coupled to a first rigid circuit board positioned within a first housing of a first modular electrical device. The first floating connector can be coupled to a flexible circuit element positioned within a second housing of a second modular electrical device, the flexible circuit element coupled to a circuit board positioned within a second housing of a second modular electrical device. The second housing includes a first latch plate adjustable between an unlatched position and a latched position, the first latch plate including a biasing member, such that, when the first modular electronic device is pressed together with the second modular electronic device, the biasing member applies a force to the first floating connector during a latch plate transition position to ensure that the first floating connector has fully mated with the first stationary connector.

To the accomplishment of the foregoing and related ends, the embodiments, then, comprise the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

BRIEF DESCRIPTION OF THE DRAWINGS

The embodiments will hereafter be described with reference to the accompanying drawings, wherein like reference numerals denote like elements, and:

FIG. 1 is a perspective exploded view of a modular overload relay assembly, according to embodiments of the present invention;

FIG. 2 is a perspective view of the modular overload relay assembly of FIG. 1 in a horizontal orientation, and coupled to a contactor, the contactor mounted to din rail;

FIG. 27 is an exploded view of a sensing module of the modular overload relay assembly, according to embodiments of the present invention;

FIG. 28 is a partial side perspective view of a voltage sensor contact coupled to a circuit board and a phase conductor in a box lug, with a load wire in the box lug;

FIG. 29 is a partial bottom perspective view of the voltage sensor contact coupled to the circuit board and the phase conductor in the box lug;

DETAILED DESCRIPTION OF THE INVENTION

Figure 3:
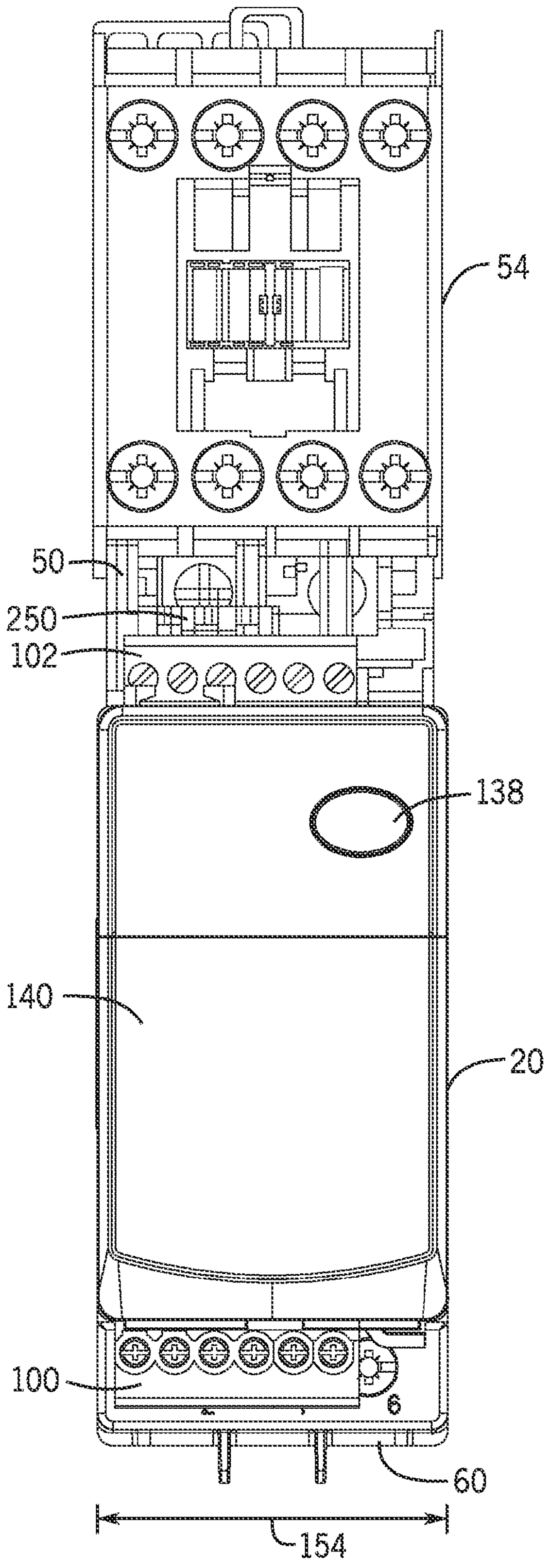
FIG. 3 is a plan view of the modular overload relay assembly of FIG. 2 in a horizontal orientation, and coupled to the contactor.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein.

The detailed description is to be read with reference to the figures. The figures depict selected embodiments and are not intended to limit the scope of embodiments of the invention. Skilled artisans will recognize the examples provided herein have many useful alternatives and fall within the scope of embodiments of the invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. As used herein, unless expressly stated otherwise, “connected” means that one element/feature is directly or indirectly connected to another element/feature, and not necessarily electrically or mechanically. Likewise, unless expressly stated otherwise, “coupled” means that one element/feature is directly or indirectly coupled to another element/feature, and not necessarily electrically or mechanically.

As used herein, the term “processor” may include one or more processors and memories and/or one or more programmable hardware elements. As used herein, the term “processor” is intended to include any of types of processors, CPUs, microprocessors, microcontrollers, digital signal processors, or other devices capable of executing software instructions.

Embodiments of the invention may be described herein in terms of functional and/or logical block components and various processing steps. It should be appreciated that such block components may be realized by any number of hardware, software, and/or firmware components configured to perform the specified functions. For example, an embodiment may employ various integrated circuit components, e.g., digital signal processing elements, logic elements, diodes, etc., which may carry out a variety of functions under the control of one or more processors or other control devices. Other embodiments may employ program code, or code in combination with other circuit components.

The various embodiments of the invention will be described in connection with a modular overload relay adapted to couple to an electromagnetic contactor. That is because the features and advantages of the invention are well suited for this purpose. Still, it should be appreciated that the various aspects of the invention can be applied in other overload relay configurations, not necessarily modular, and that are capable of stand-alone operation or that can be coupled to other devices, including solid state contactors.

Specifically, embodiments of the invention provide a modular overload relay assembly capable of providing multiple functions. A first portion of the modular overload relay assembly can be a sensing module having a first housing supporting integrated phase current conductors and load side power terminals, where the integrated phase current conductors are preformed and receivable by a contactor. The integrated phase current conductors conduct load current from the contactor (line side of the modular overload relay assembly) through the modular overload relay assembly to the load side terminals, and current sensing devices and associated sensing circuitry monitors the current in the phase current conductors to produce a signal proportional to the current. The sensing module includes a sensing module electrical connector extending from a front side of the first housing and communicating with the sensing module circuitry.

A second portion of the multi-function overload relay can be a controller module having a second housing attachable to the front side of the sensing module. The controller module can include a front side electrical connector located on a front side of the controller module and a back side electrical connector located on a back side of the controller module. The back side electrical connector can mate with the sensing module electrical connector when the controller module is coupled to the front side of the sensing module housing. Circuitry within the controller module can communicate with the sensing module circuitry to augment its function. The second housing of the controller module can include terminals providing an interface for power and input and output signals.

A third portion of the multi-function overload relay can be a communication module having a third housing attachable to the front side of the controller module. The controller module electrical connector located on the front side of the controller module can mate with a communication module electrical connector when the communication module is coupled to the front wall of the controller module housing. Circuitry within the communication module can communicate with the controller module circuitry and the sensing module circuitry to augment its function. Use of the communication module to provide an optional network connection to an overload relay can reduce the cost of the sensing module and/or controller module.

In this configuration, a physical separation of functions of the modules can be incorporated into many electronic devices, including a modular overload relay, allowing a variety of overload relays of different functions to be offered in a cost-effective basis. The electrical connectors between the modules allows division of functions to be accomplished with minimal interface cost. The modules can utilize an attachment configuration and method that provides an advantage for many electronic devices and environments that have the potential for high vibration, including overload relays in industrial environments. The attachment configuration and method may not increase the cost burden of any of the modules, and yet that is robust against the potential high vibration environment of an overload relay, especially when mounted directly to a contactor.

Any of the circuitry described herein can provide functions including motor jam detection, current imbalance detection, and ground fault current detection, for example. The circuitry can provide remote reset or trip of the overload relay. Embodiments of the invention can provide remote resetting as an optional feature, thereby reducing the cost of the overload relay assembly.

Referring now to FIGS. 1 and 2, a modular overload relay assembly 20 can include a sensing module 30, a controller module 32 and a communication module 34. Each of the modules 30, 32 and 34 will be described in greater detail below. The orientation of the modules will be described in terms of a horizontal stack of modules as they would be viewed while the overload relay assembly 20 is mounted to a contactor 54, and the contactor mounted to din rail 52 on a panel, typically in a cabinet and ready for use (see FIG. 2).

The sensing module 30 can include a housing 36 with a front side 40, top side 42, bottom side 44, and interior 46. Integrated phase current conductors 50 can extend from the top side 42, and are shown extending outwardly to be received by corresponding screw clamp terminals (not shown) of a contactor 54. Integrated phase current conductors 50 can comprise three preformed and prefabricated conductors of a three-phase power system. A mechanical contactor latch 56 can also extend from the top side 42 to provide a further mechanical connection between the contactor 54 and the overload relay assembly 20. Load side power terminals 60 can be accessible from the bottom side 44 to provide electrical access to the Integrated phase current conductors 50. A sensing module electrical connector 62 and latching hooks 64 can extend from the front side 40 to provide an electrical and a mechanical connection to the controller module 32. The interior 46 of the sensing module 30 can include a sensing module circuit board 66 including current sensing devices 68 and 70, such as current transformers (see FIG. 27).

The controller module 32 can include a housing 76 with a front side 78, a back side 80, a top side 82, a bottom side 84, side walls 86 and 88, and interior 90. The controller module back side 80 can mechanically attach to the front side 40 of the sensing module 30 so that a back side electrical connector 96 (not visible in FIG. 1) on the controller module 32 can mate with the sensing module electrical connector 62 when the controller module 32 is attached to the sensing module 30. Latching hooks 64 attached to or molded into the sensing module housing 36 can engage corresponding holes 98 (not visible in FIG. 1) in the back side 80 of the controller module 32. In an alternative embodiment, screws or other known coupling means may be used to mechanically couple the controller module 32 to the sensing module 30. The interior 90 of the controller module 32 can include a controller module circuit board 92 including a processor 94, for example (see FIG. 4).

In some embodiments, terminal block 100 and/or 102 can extend from either or both of the top side 82 and the bottom side 84, and can provide a pass through feature between terminal block 100 and terminal block 102. The terminal block 100, 102 can provide an access point for providing control power to the control module 32, which in turn can provide power to the sensing module 30 and the communications module 34. The controller module 32 can convert the control power to different voltage levels for the sensing module 30 and the communications module 32. Port 106 can also be accessed on either or both of the top side 82 and the bottom side 84. The port 106 can be used to couple to expansion I/O and/or a human machine interface (HMI), for example.

Figure 5:
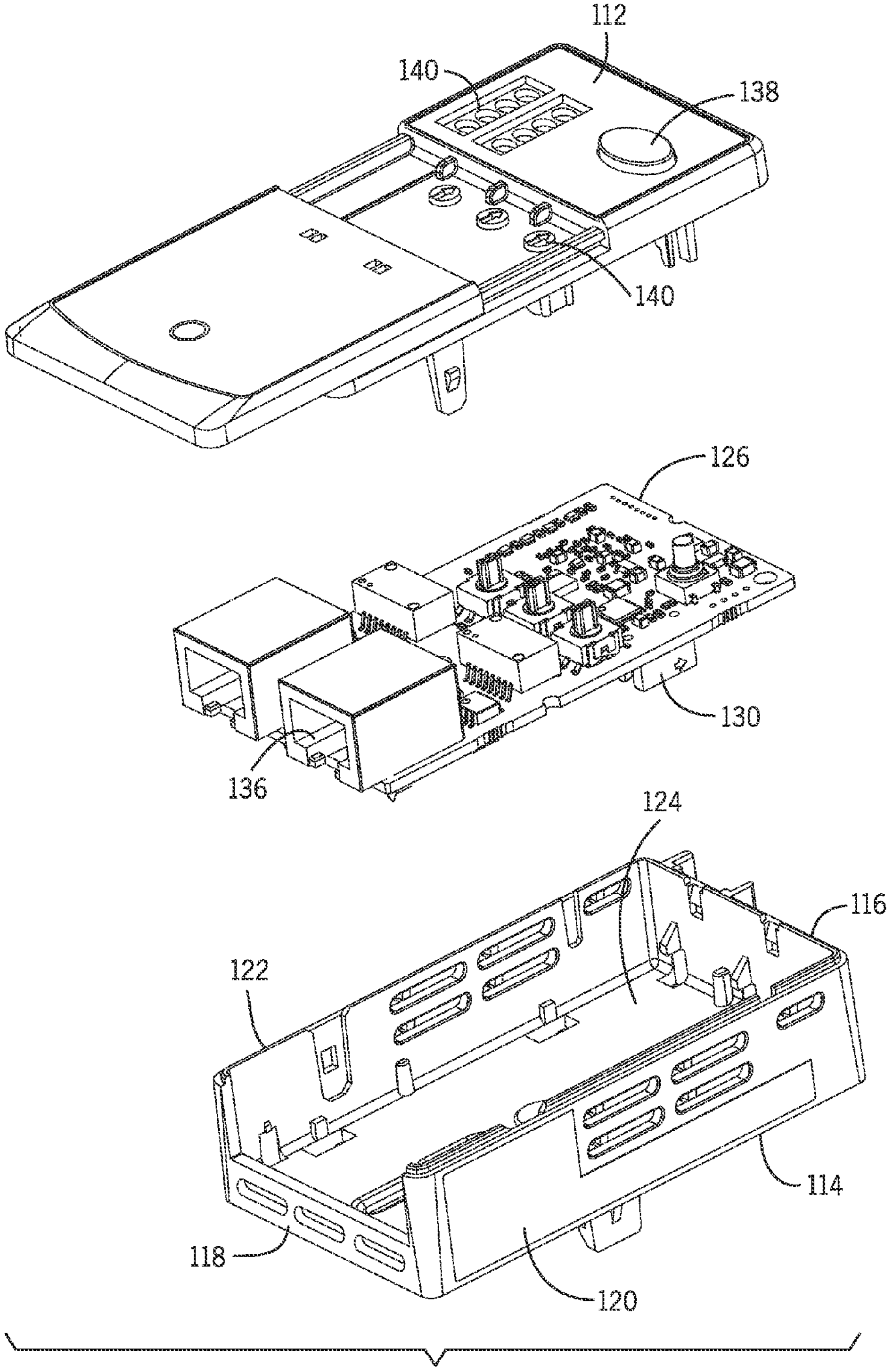
FIG. 5 is an exploded view of a communication module of the modular overload relay assembly.

The communication module 34 can include a housing 110 with a front side 112, a back side 114, a top side 116, a bottom side 118, side walls 120 and 122, and interior 124. The communication module back side 114 can mechanically attach to the front side 78 of the controller module 32 so that a back side electrical connector 130 (not visible in FIG. 2) on the communication module 34 can mate with a front side electrical connector 132 on the controller module 32 when the communication module 34 is attached to the controller module 32. Latching hooks 64 attached to or molded into the communication module housing 110 can engage corresponding holes 134 in the front side 78 of the controller module 32. In an alternative embodiment, screws or other known coupling means may be used to mechanically couple the communication module 34 to the controller module 32. The interior 124 of the communication module 34 can include a communication module circuit board 126 (see FIG. 5).

One or more communication ports 136 can be accessed on the front side 112, top side 116 and/or the bottom side 118. In some embodiments, the communication module 34 can be a wireless communication module, and therefore may not include a communication port. The communication module 34 can provide support for a multitude of communication protocols, including, but not limited to, single and dual port Ethernet, DeviceNet, ProfiBus, Modbus, and other known and future developed protocols. In other embodiments, the communication module 34 may not support communications.

The front side 112 of the communication module 34 can also include an overload reset button 138 to provide a manual or electrical reset function for the overload relay 20 to re-open a normally open contact and/or close a normally closed contact. It is to be appreciated that the overload reset button 138 can be located on any of the modules. The communication module 34 can also include other known inputs and outputs 140, such as switches to adjust overload relay parameters and/or setting node address, and status LEDs for power, Trip/Warn, network activity, and the like (see FIG. 5).

Figure 4:
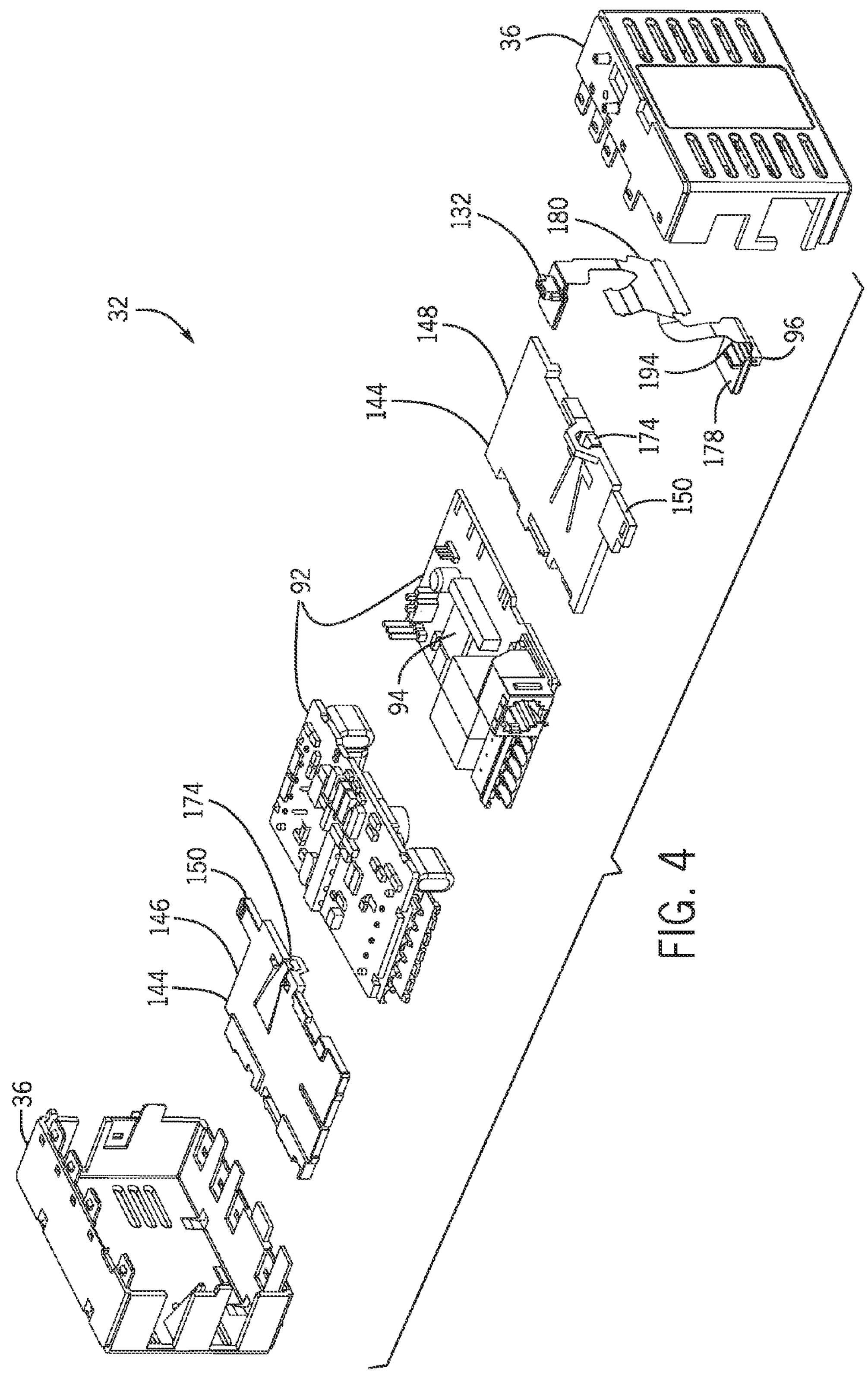
FIG. 4 is an exploded view of a controller module of the modular overload relay assembly.

Referring to FIG. 4, in order to mechanically attach the controller module 32 to the sensing module 30, and the communication module 34 to the controller module 32, in addition to the latching hooks 64, in some embodiments, the controller module 32 can include at least one latch plate 144. In the embodiment shown in FIG. 2, the controller module 32 includes a front latch plate 146 and a back latch plate 148. In some embodiments, the latch plate 144 can be the same for the front latch plate 146 and the back latch plate 148. In other embodiments, one latch plate 144 can secure both the front side 78 and the back side 80 of the controller module 32. In yet other embodiments, the latch plate 144 can slide on a side wall 86 and/or 88 of the controller module 32 and latch one or both the front side 78 and the back side 80 of the controller module 32.

Figure 6:
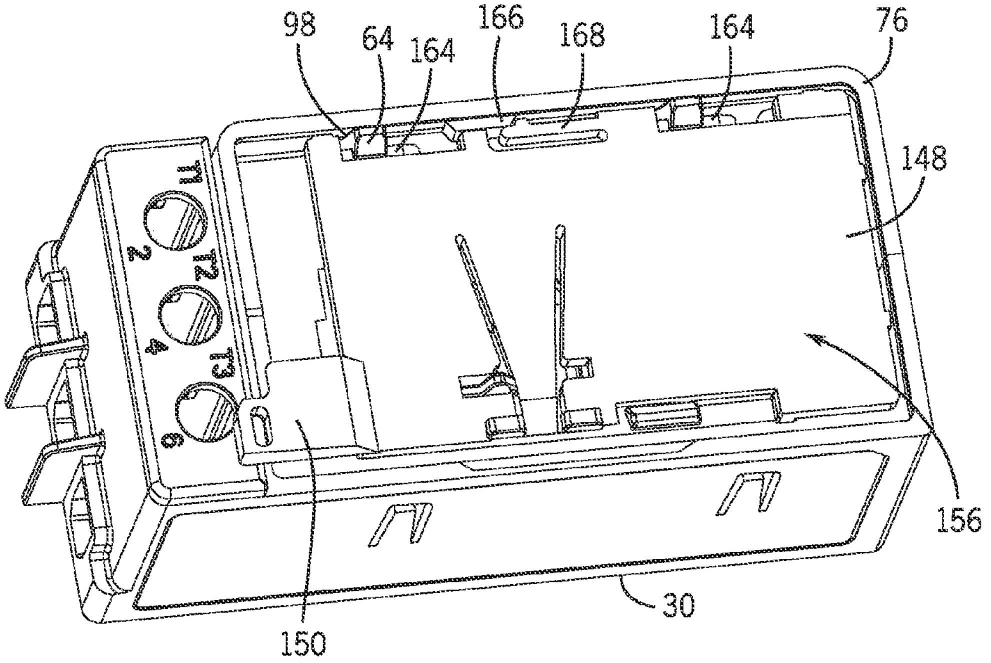
FIG. 6 is a perspective view of a latch plate in a latched position.
Figure 7:
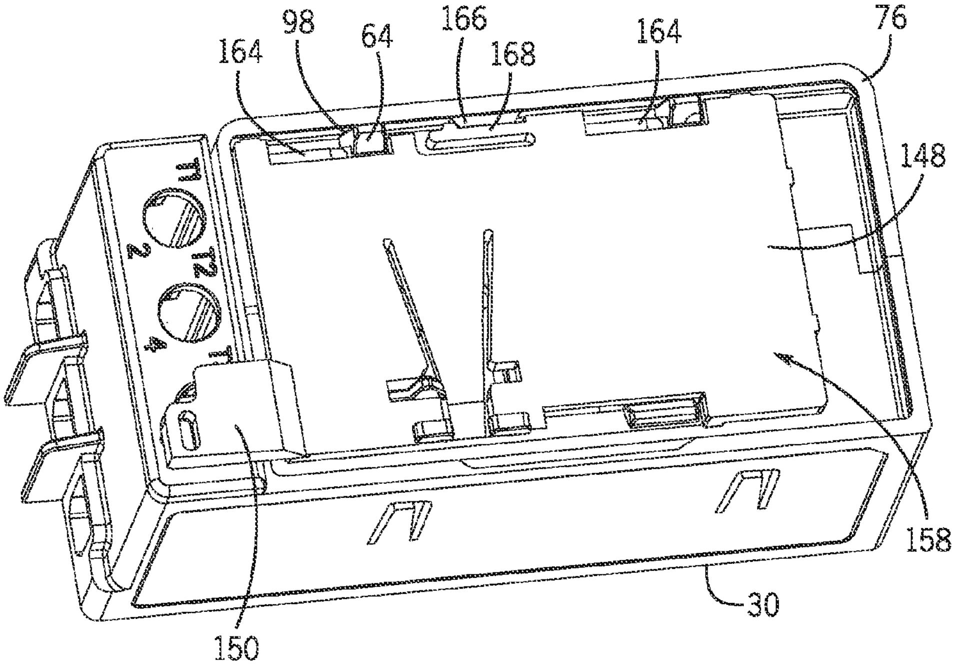
FIG. 7 is a perspective view of the latch plate of FIG. 6 in an unlatched position.

Referring to FIGS. 4, 6 and 7, each latch plate 146, 148 can include a latch handle 150. The latch plates 146, 148 can be used to mechanically engage the latching hooks 64 that protrude into the front side 78 and back side 80 of the controller module 32 when the controller module 32 is attached to the sensing module 30, and the communications module 34 is attached to the controller module 32. For example, the latch handle 150 can be used to manually slide the latch plate 148 into a latched position 156 (see FIG. 6) to secure the controller module 32 to the sensing module 30. To disengage the controller module 32 from the sensing module 30, the latch handle 150 can be used to manually slide the latch plate 148 into an unlatched position 158 (see FIG. 7) so the controller module 32 can be removed from the sensing module 30. The latch plate 148 (and 146) can include a hook edge 164 that, when slid into the latched position 156, slides under the latching hook 64 to restrict the latching hook 64 from being removed from the latching hook holes 98. A detent 166 on the controller module housing 76 can engage a biased arm 168 on the latch plate 148 (and 146) to retain the latch plate 148 in the latched 156 or unlatched 158 position.

In order to electrically couple the controller module 32 to the sensing module 30, and the communication module 34 to the controller module 32, the sensing module front side electrical connector 62 can be coupled to the controller module back side electrical connector 96, and the communication module back side electrical connector 130 can be coupled to the controller module front side electrical connector 132.

Referring to FIG. 4, in some embodiments, a latch plate 144 can include a biasing member 174. The biasing member 174 can be an integral component of the latch plate 144, or the biasing member 174 can be an extended member, such as a spring, coupled to the latch plate 144, for example. In some embodiments, the biasing member 174 can be a plastic spring integral with the latch plate 144, or the biasing member 174 could be a metal spring coupled to the latch plate. The biasing member 174 can interact with a connector carrier 176 (see FIG. 8) to provide a connector mating force. Use of the biasing member 174 and the connector carrier 176 can facilitate a design that can employ overtravel to accommodate tolerance stackup.

Figure 8:
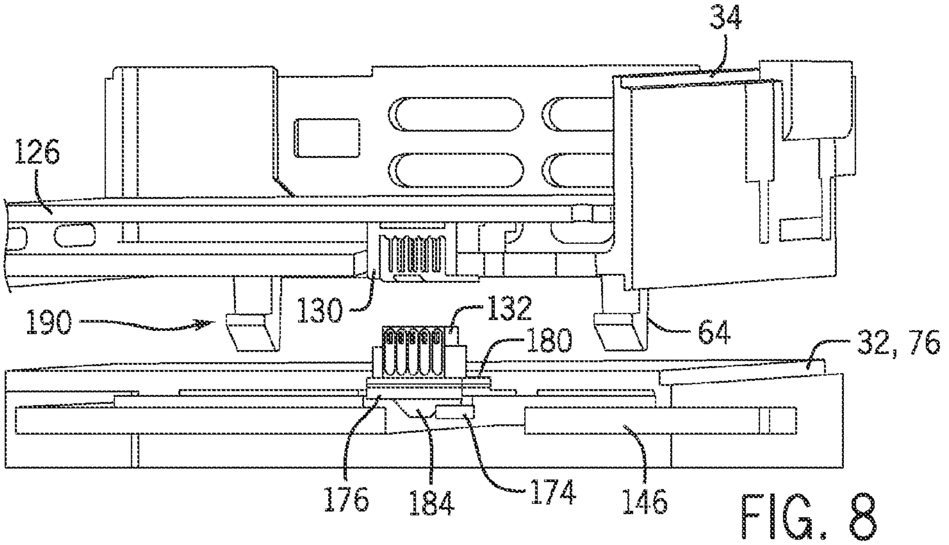
FIG. 8 is a close-up perspective side view of a communication module in a position to be coupled to a controller module, and showing the respective connectors in an unmated state.

Referring to FIG. 8 as a representative example, a portion of the communication module 34 is shown prior to being coupled to the controller module 32. In some embodiments, the communication module back side electrical connector 130 can be rigidly and electrically connected to the communication module circuit board 126. The controller module front side electrical connector 132 can be electrically connected to a flexible circuit element, such as a flexible circuit board 180 and mechanically coupled to the connector carrier 176. The flexible circuit board 180 can be electrically connected to the controller module circuit board 92 (see also FIGS. 25 and 26).

Figure 11:
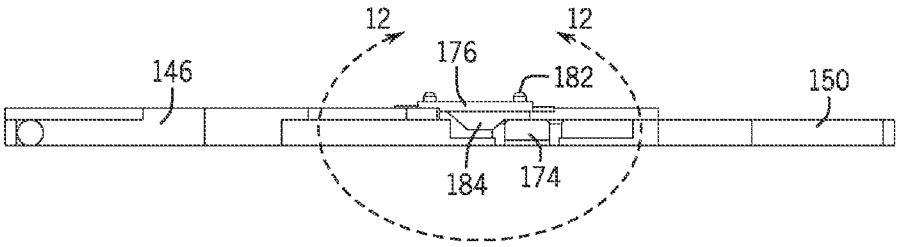
FIGS. 11 and 12 are side views of a latch plate, and showing a biasing member in an unlatched state in relation to a connector carrier and associated cam.
Figure 12:
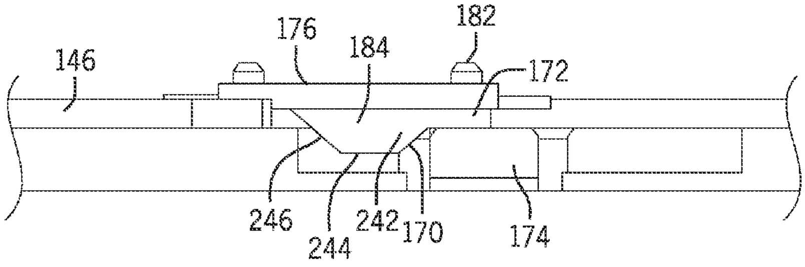
Figure 13:
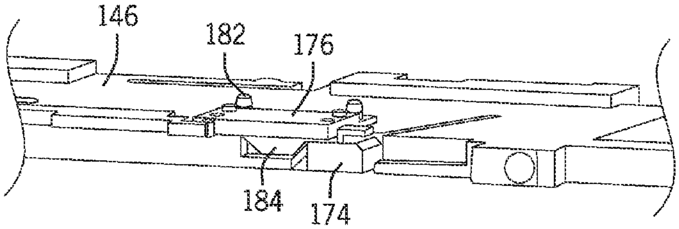
FIGS. 13 and 14 are perspective views of the latch plate and biasing member of FIG. 11 in the unlatched state.
Figure 14:
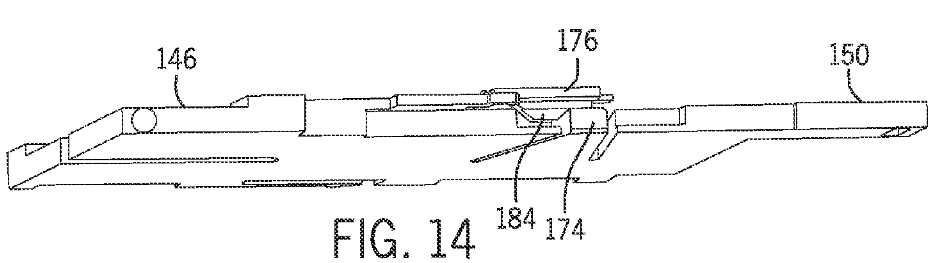

As shown in FIG. 1, coupling the communication module back side electrical connector 130 to the controller module front side electrical connector 132 can be a blind mate connection, in that, as the communication module 34 is being coupled to the controller module 32, the mating of the communication module back side electrical connector 130 to the controller module front side electrical connector 132 can be visually obstructed for the user. To insure connector alignment, the connector carrier 176 can include at least one alignment member 182 (see FIGS. 11 and 12) that can serve to provide X-Y positioning when coupling the communication module 34 to the controller module 32. It is to be appreciated that other alignment features can also be included.

Figure 9:
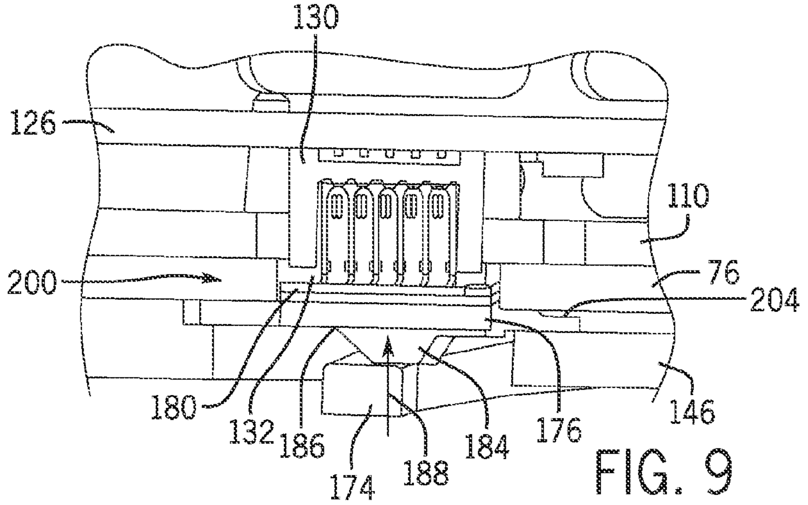
FIG. 9 is a close-up perspective side view of the communication module coupled to the controller module, and showing the respective connectors in a mated, transitional state.
Figure 10:
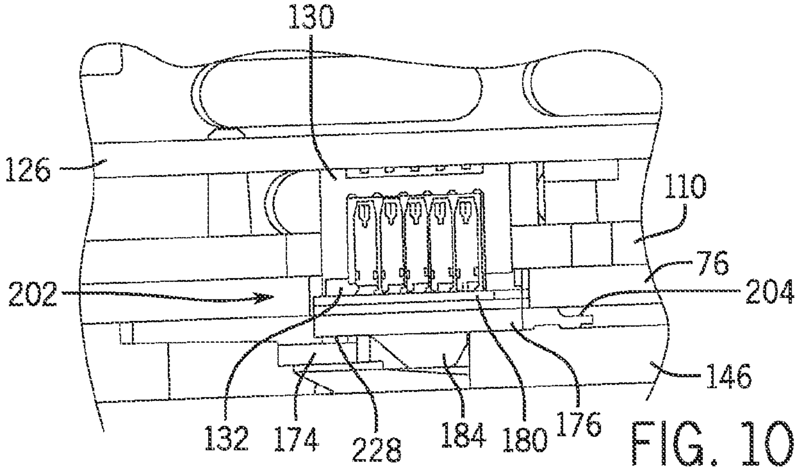
FIG. 10 is a close-up perspective side view of the communication module coupled to the controller module, and showing the respective connectors in a mated, fully latched, in use state.

Referring to FIG. 9, the connector carrier 176 can include a cam 184 on a bottom surface 186 of the connector carrier 176. The cam 184 in cooperation with the biasing member 174 can selectively apply a spring force 188 in the Z direction to the controller module front side electrical connector 132 when the front latch plate 146 is being transitioned from the unlatched position 158 to the latched position 156. Referring to FIG. 10, the cam 184 can also disengage from the biasing member 174 to provide mechanical isolation of the controller module front side electrical connector 132 from the controller module 32. When the communication module back side electrical connector 130 is coupled to the controller module front side electrical connector 132, the controller module front side electrical connector 132 can be mechanically coupled to the controller module only through the flexible circuit board 180, providing mechanical isolation between the controller module housing 76 and the controller module front side electrical connector 132.

Referring to FIGS. 8-23, the cam 184 in cooperation with the biasing member 174 can provide a plurality of operational states. In some embodiments, operational states can include an unmated, unlatched position 190 (see FIGS. 8 and 11-14), a mated, unlatched position 198, where the modules are pressed together by the user (see FIG. 15), a mated, transitioning to latched position 200 (see FIGS. 9 and 16-19), and a mated, fully latched position 202 (see FIGS. 10 and 20-23). Each will be described in greater detail below.

Referring to FIGS. 8 and 11-14, in the unmated, unlatched position 190, a first section 242 of the cam 184 on the connector carrier 176 can include a first edge 170 and a detent 172 (see FIG. 12) that can maintain the biasing member 174 and front latch plate 146 in the unlatched position 190 and can provide a light force to deflect the biasing member 174 and hold the controller module front side electrical connector 132 in an overtravel Z-position. The detent 172 can cause the biasing member 174 to force the connector carrier 176 to contact the inside of the controller module housing 76. An initial force can be needed to begin mating the communication module back side electrical connector 130 to the controller module front side electrical connector 132. The detent 172 can provide only a light load on the biasing member 172 in shipped state, which helps to reduce or eliminate creepage and/or relaxation. This can be more of a factor when the biasing member 174 is plastic as compared to metal.

Figure 15:
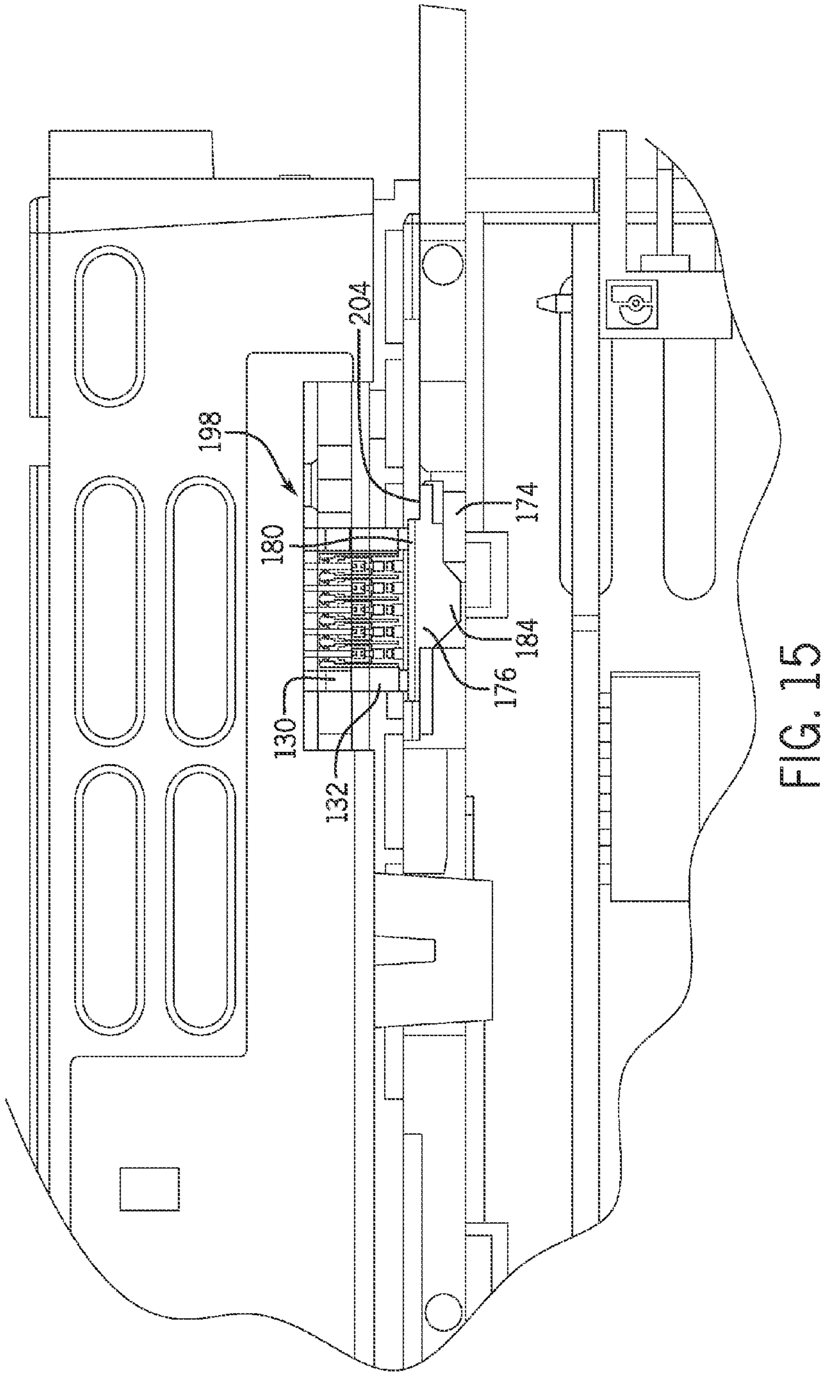
FIG. 15 is a close-up perspective side view of the latch plate and biasing member in an unlatched state after modules have been coupled together but before the modules have been latched together.
Figure 16:
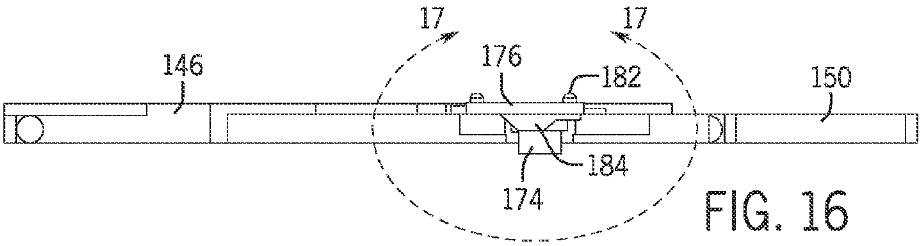
FIGS. 16 and 17 are side views of the latch plate, and showing the biasing member in a transitional state in relation to the connector carrier and associated cam.
Figure 17:
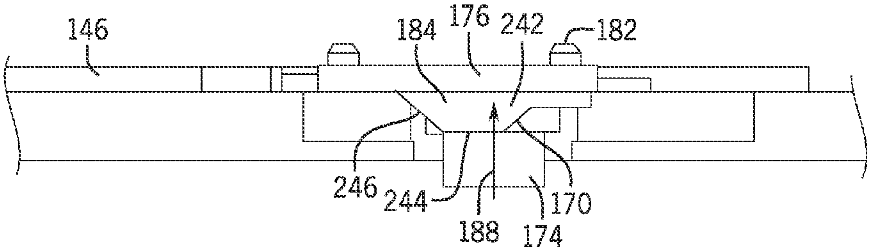
Figure 18:
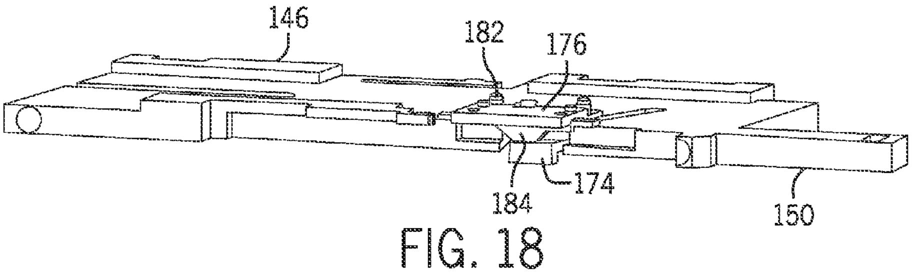
FIGS. 18 and 19 are perspective views of the latch plate and biasing member of FIG. 16 in the transitional state.
Figure 19:
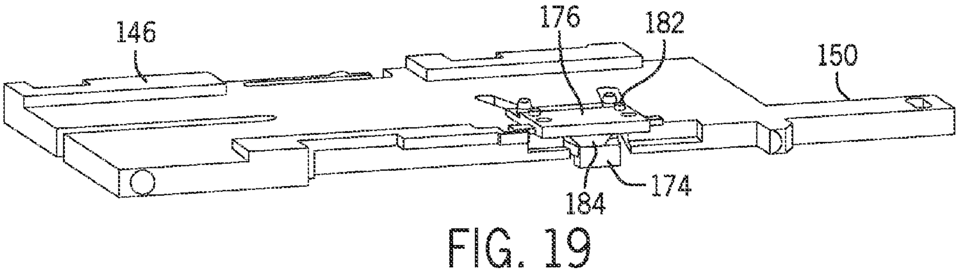
Figure 20:
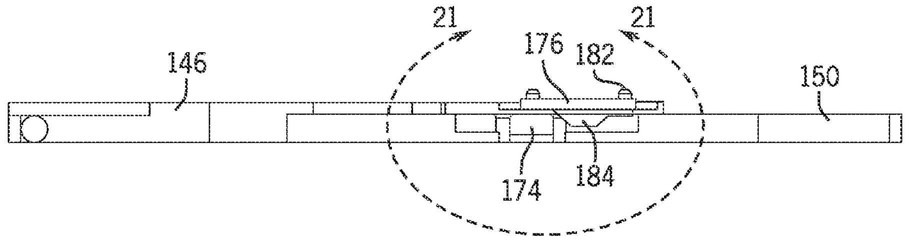
FIGS. 20 and 21 are side views of the latch plate, and showing the biasing member in a fully latched, in use state in relation to the connector carrier and associated cam.
Figure 21:
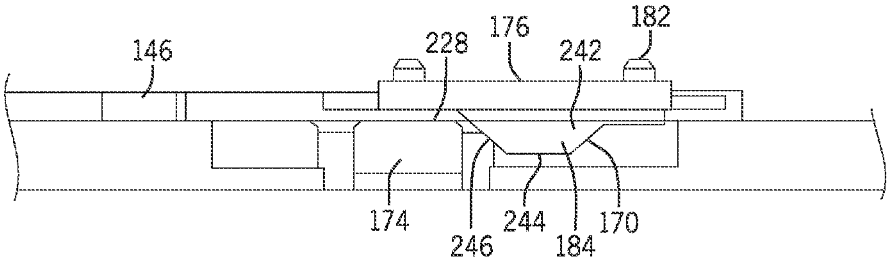
Figure 22:
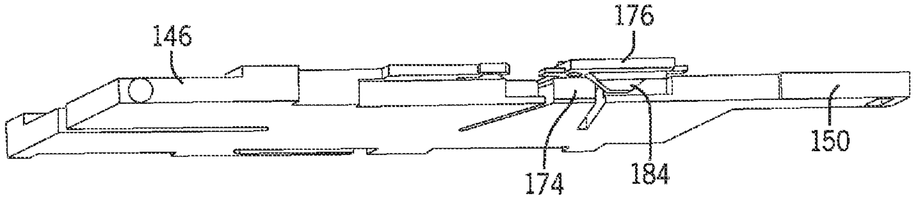
FIGS. 22 and 23 are perspective views of the latch plate and biasing member of FIG. 20 in the fully latched, in use state.
Figure 23:
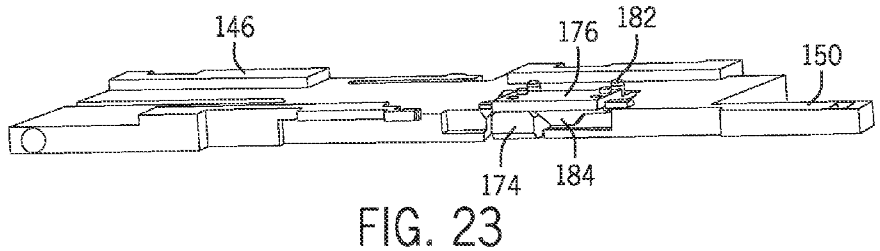

Referring to FIG. 15, in the mated, unlatched position 198, where the modules are pressed together by the user, a gap 204 can be created between the controller module housing 76 and the connector carrier 176 if the biasing member 174 does not overcome the mating force of the communication module back side electrical connector 130 to the controller module front side electrical connector 132. This mating force can slightly push the controller module front side electrical connector 132 into the interior 90 of the controller module housing, causing the gap 204.

Referring to FIGS. 9 and 16-19, the mated, transitioning to latched can be a momentary state between unlatched and latched that can provide a peak Z force 188 to fully mate the connectors. The transition state during latching allows high biasing member 174 force to fully mate the connectors without a risk of biasing member relaxation. In the mated, transitioning to latched position 200, the communication module back side electrical connector 130 has been mated to the controller module front side electrical connector 132. The front latch plate 146 can be slid from an unlatched position 158 to a latched position 156 (see FIGS. 6 and 7). The sliding of the latch plate 146 can cause the biasing member 174 to overcome the first edge 170 of the cam 184, and next interact with a second section 244 of the cam 184. The second section 244 of the cam 184 can cause the biasing member to further deflect to provide an increased Z force 188 on the connector carrier 176 to fully mate the communication module back side electrical connector 130 to the controller module front side electrical connector 132. When the connectors are fully mated, the gap 204 between the controller module housing 76 and the connector carrier 176 can be present.

Referring to FIGS. 10 and 20-23, in the mated, fully latched position 202, the communication module back side electrical connector 130 is fully mated to the controller module front side electrical connector 132. The front latch plate 146 has been slid from the unlatched position 158 to the latched position 156 (see FIGS. 6 and 7). The sliding of the latch plate 146 can cause the biasing member 174 to overcome the force of the second section 244 of the cam 184, and slide past a third section 246 of the cam 184. In the latched position 156, the biasing member 174 disengages generally completely from both the cam 184 and the connector carrier 176 and can cause the gap 204 to be present between the controller module housing 76 and the connector carrier 176, and a gap 228 between the biasing member 174 and the connector carrier 176.

In this latched position 156, the controller module front side electrical connector 132 and carrier 176 can be mechanically coupled to the communication module 34 by the connector mating forces more significantly than the controller module 30 because the controller module front side electrical connector 132 is mechanically coupled to the controller module 32 by the compliant flexible circuit board 18. The gaps 204 and 228 can provide the isolation and protection from connector contact wear due to module-to-module relative motion.

Figure 24:
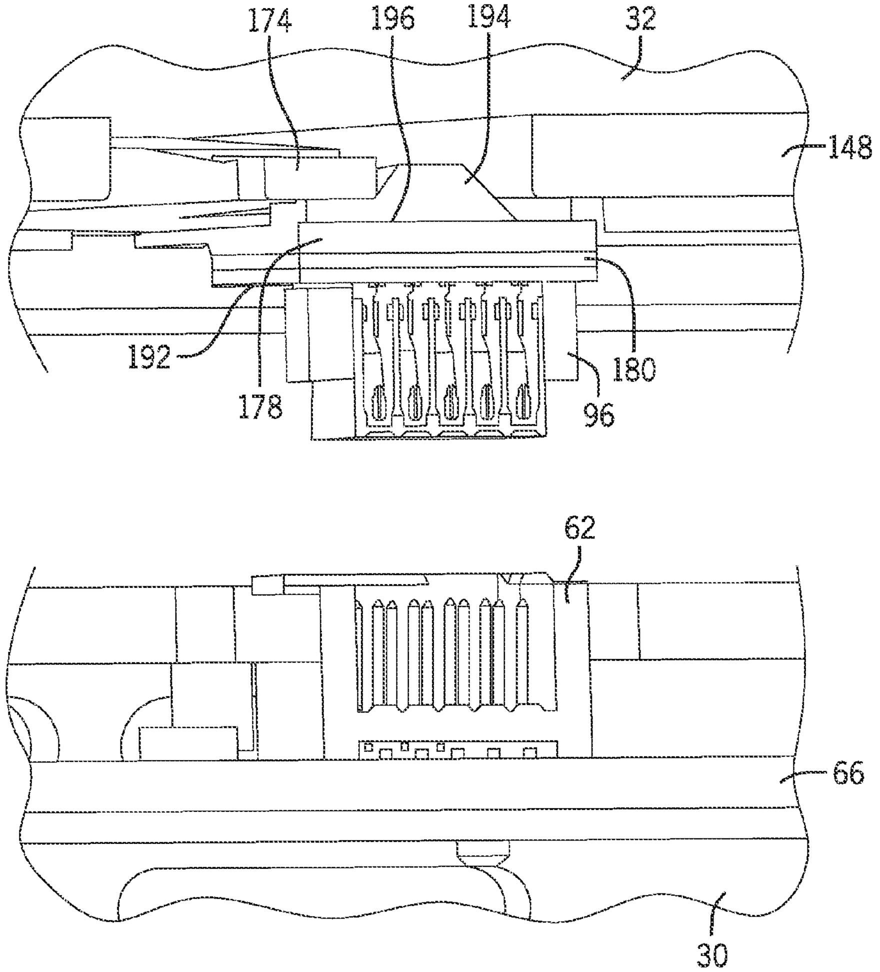
FIG. 24 is a close-up perspective side view of a controller module in a position to be coupled to a sensing module, and showing the respective connectors in an unmated state.

As with the communication module back side electrical connector 130 and the controller module front side electrical connector 132, referring to FIG. 24, in some embodiments, the sensing module front side electrical connector 62 can be rigidly and electrically connected to the sensing module circuit board 66. The controller module back side electrical connector 96 can be electrically connected to the flexible circuit board 180 and mechanically coupled to an additional connector carrier 178 for the controller module back side electrical connector 96.

As with coupling the communication module back side electrical connector 130 to the controller module front side electrical connector 132, coupling the controller module back side electrical connector 96 to the sensing module front side electrical connector 62 can also be a blind mate connection, in that, as the controller module 32 is being coupled to the sensing module 30, the mating of the controller module back side electrical connector 96 to the sensing module front side electrical connector 62 can be visually obstructed for the user. To insure connector alignment, the connector carrier 178 can include at least one alignment member 192 and/or other alignment features that can serve to provide X-Y positioning when coupling the controller module 32 to the sensing module 30.

The connector carrier 178 can be the same or similar to connector carrier 176, and can include a cam 194 on a top surface 196 of the connector carrier 178. The cam 194 in cooperation with the biasing member 174 can selectively apply a spring force 188 in the Z direction to the controller module back side electrical connector 96 when the back latch plate 148 is being transitioned from the unlatched position 158 to the latched position 156. The cam 194 can also disengage from the biasing member 174 to provide mechanical isolation of the controller module back side electrical connector 96 from the controller module 32. When the controller module back side electrical connector 96 is coupled to the sensing module front side electrical connector 162, the controller module back side electrical connector 96 can be mechanically coupled to the controller module 32 only through the flexible circuit board 180, providing mechanical isolation between the controller module housing 76 and the controller module back side electrical connector 96.

Cam 194 in cooperation with the biasing member 174 can provide the same or similar plurality of operational states as cam 184, and as shown and described in relation to FIGS. 8-23. Cam 194 in cooperation with the biasing member 174 can ensure complete contact engagement during assembly of one or more modules to another, thereby mechanically isolating the mated connector pair from module-to-module relative motion after the modules are latched together.

Figure 26:
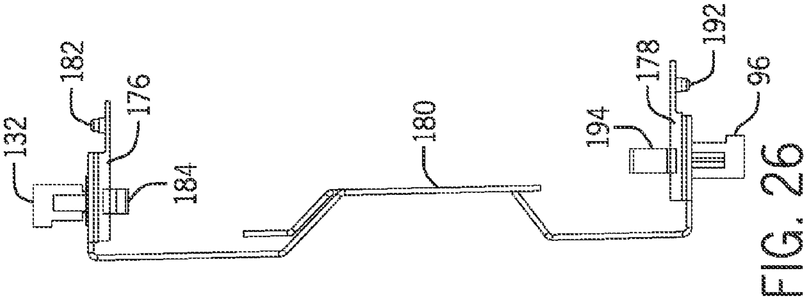
FIG. 26 is a side view of the flexible circuit board of FIG. 25, and showing connector carriers coupled to the flexible circuit board.
Figure 25:
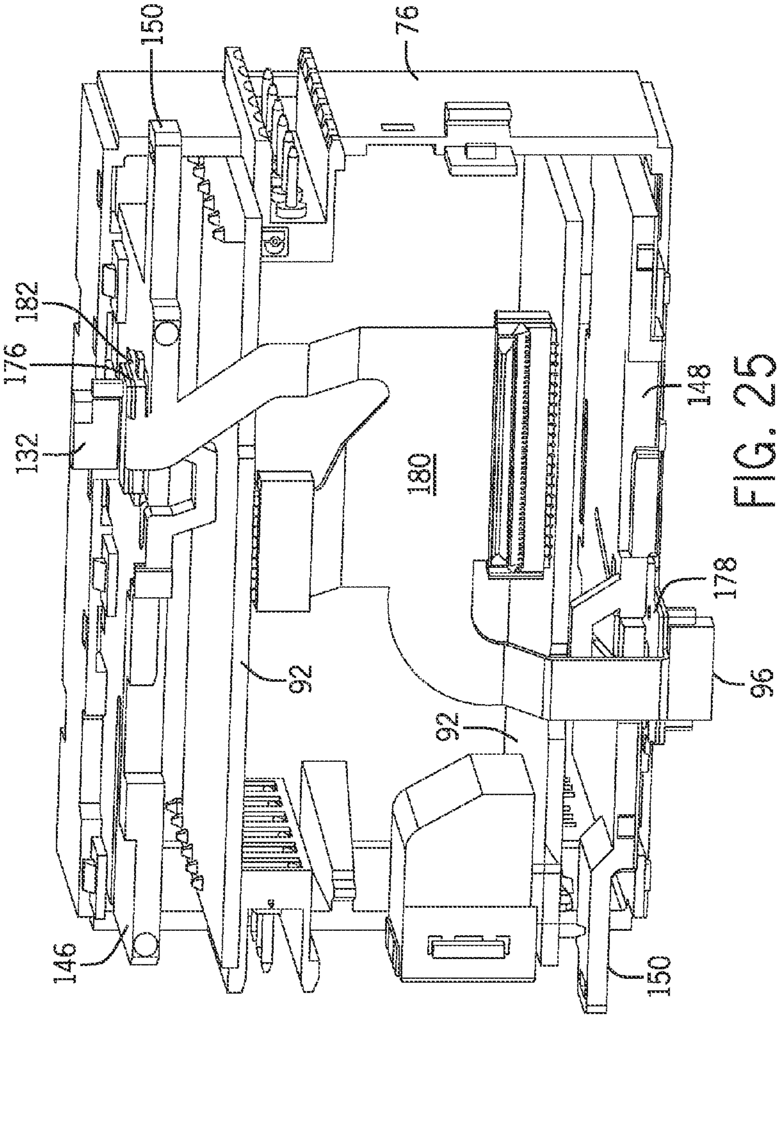
FIG. 25 is a perspective view of a controller module with section of the housing removed to expose the interior, and showing a flexible circuit board coupled to a controller module circuit board, the flexible circuit board coupled to a front electrical connector and a back electrical connector.

Referring to FIGS. 25 and 26, the connectors 96 and 132 affixed to the flexible circuit board 180 can carry, for example, power and signals to and from the controller module circuit board 92 to the controller module front side electrical connector 132 and controller module back side electrical connector 96. In other embodiments, the flexible circuit element 180 can comprise a rigid flex circuit board and/or flat flexible cables, as non-limiting examples. The use of a flexible circuit board 180 allows both connectors in the controller module 32 to first fully mate, and then allows both connectors 96, 132 in the controller module 32 to "float," meaning mechanical isolation with only the flexible circuit element 180 providing a connection to the connector. Connector engagement can provide one aspect of assembling the modular overload relay assembly 20, and module attachment using latching hooks 64 can provide another aspect of assembling the modular overload relay assembly 20.

As described above, the connectors 96, 132 on the flexible circuit board 180 within one of the modules will blind mate to the adjacent module during intuitive assembly of the modules. The mechanical latching system comprising the latch plate 144 and the latching hooks 64 that holds the modules together provides connector engagement force and overtravel to insure full mating prior to completion of the module latching operation and then the mechanical latching system disengages from the connector substantially completely so the only mechanical linkage of the mated connector pair to the main module is the flexible circuit element 180. The flexible circuit element, for example the flexible circuit board 180, communicates nearly zero force from module-to-module relative motion to the contact interface.

Referring to FIGS. 27-33, in some embodiments, the sensing module 30 can include voltage measurement and power calculation capabilities using a voltage sensor contact 206. The voltage sensor contact 206 can provide an electrical connection 212 with a phase conductor 214 carrying a load current at a load voltage. The electrical connection 212 can be made internal to the overload relay assembly 20, and without extra connection or effort on the part of the user. Providing the voltage measuring function internal to the sensing module 30 can eliminate the need for any additional external wiring, terminal blocks, or use of additional modules, allowing the overload relay to perform the voltage measurement and power calculation functions without increasing the width or the depth of the overload relay 20. As seen in FIGS. 2 and 3, the controller module 32 can be coupled to the front of the sensing module 30, and the communication module 34 can be coupled to the front of the controller module 32, all while maintaining a predetermined width 154 of the modular overload relay. The predetermined width can comprise known standard widths for contactors and overload relays including 45 mm, 59 mm, 72 mm and 95 mm, as non-limiting examples.

The voltage sensor contact 206 provides a low cost, low physical volume device and method to measure voltage and, therefore, calculate power. The overload relay assembly 20 can support the CIP energy object, and can support a user's desire to manage power, and/or employ smart grid methods, for example.

Figure 32:
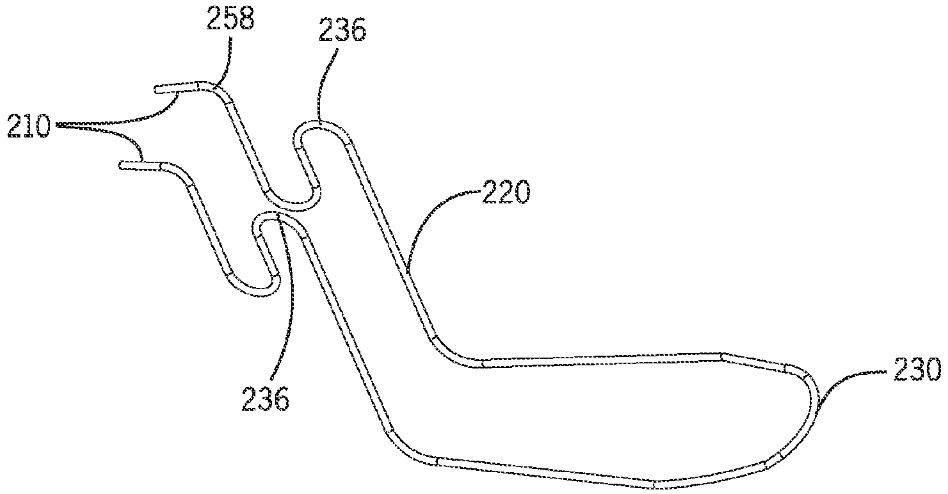
FIGS. 32 and 33 are perspective views of embodiments of a voltage sensor contact.
Figure 33:
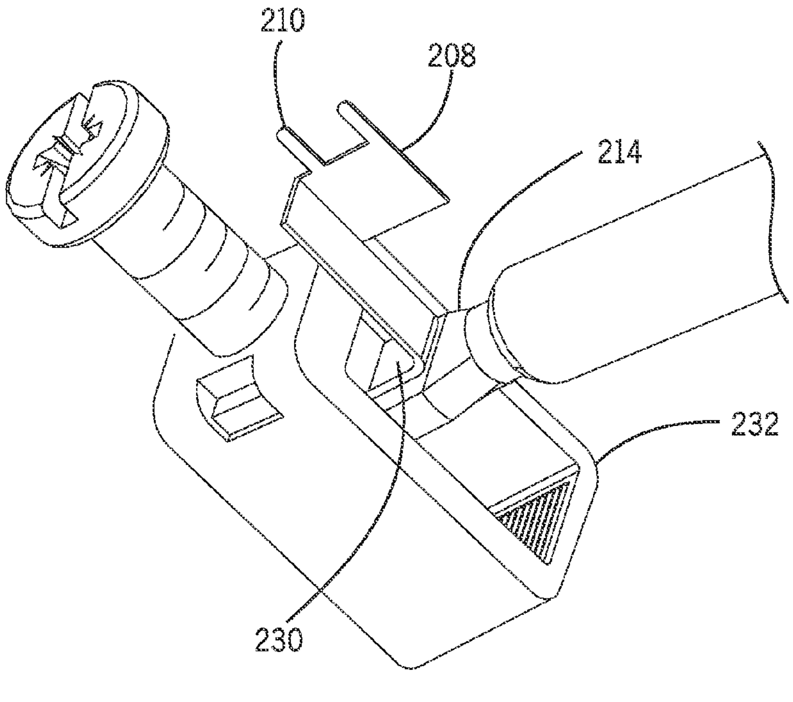
Figure 34:
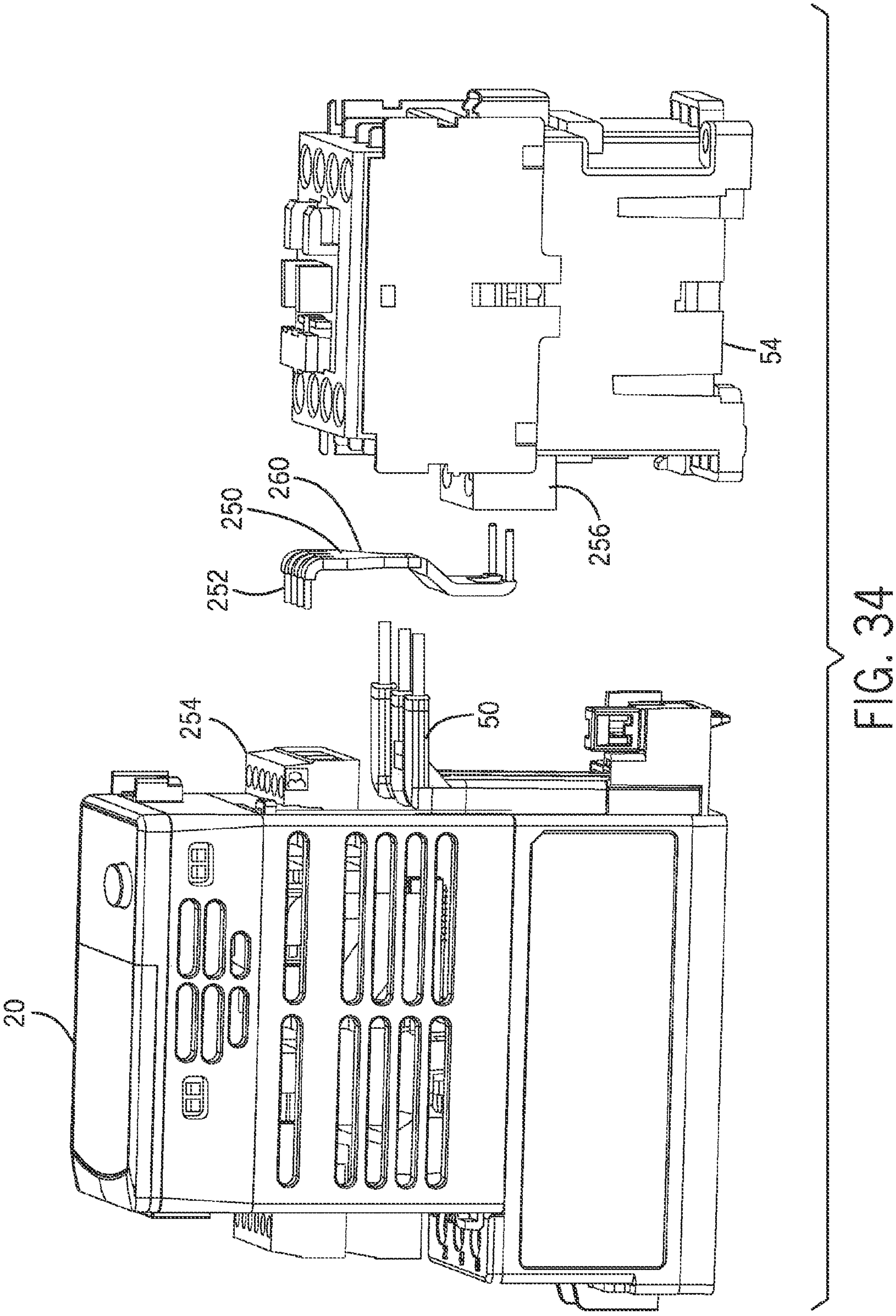
FIG. 34 is a perspective view of a preformed coil interface, according to embodiments of the present invention, prior to being coupled to the modular overload relay assembly and a contactor.
Figure 35:
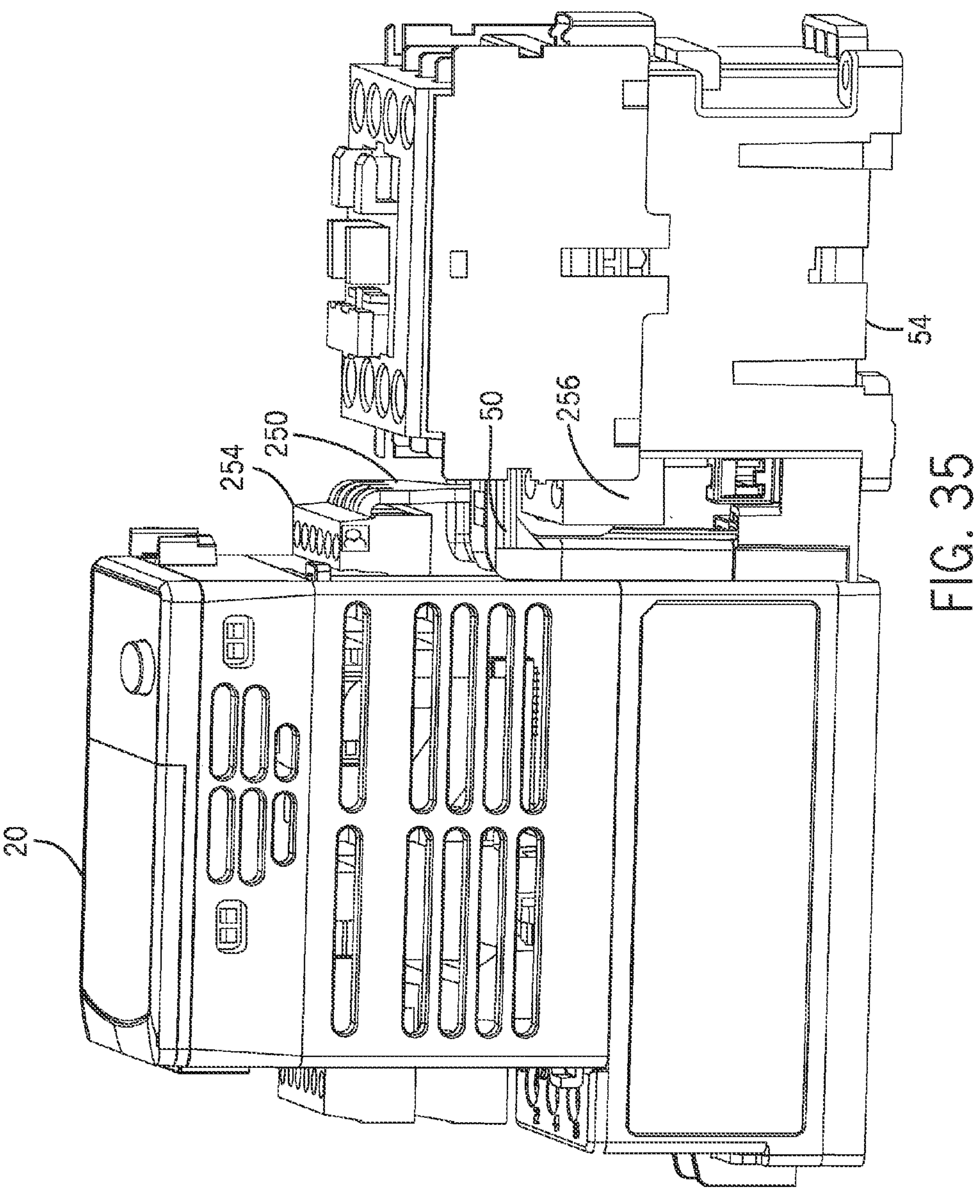
FIG. 35 is a perspective view of the preformed coil interface of FIG. 34 after being coupled to the modular overload relay assembly and a contactor.

Referring to FIG. 27, in some embodiments, the voltage sensor contact 206 can comprise an electrical conductor 220 positioned generally internal to the sensing module 30. The electrical conductor 220 can include one or more ends 210 to couple to the sensing module circuit board 66, and two are shown, as seen in FIG. 32, Or alternatively, the electrical conductor 220 can be a formed or stamped part 208 (see FIG. 33). It is to be appreciated that the electrical conductor 220 can comprise any known electrically conductive material or materials including a single or multi-stranded wire, and/or conductive fibers, for example.

Figure 30:
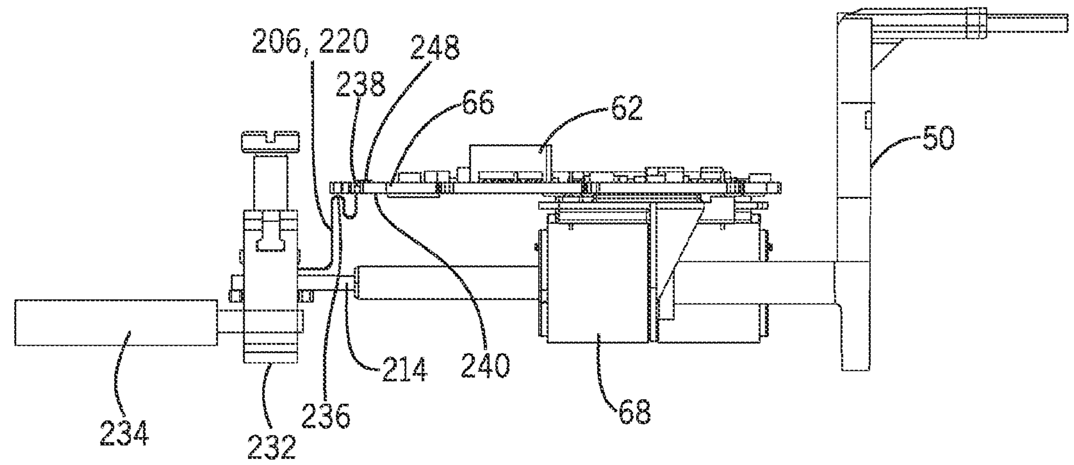
FIG. 30 is a side view of the voltage sensor contact coupled to the circuit board and the phase conductor in the box lug, with the load wire in the box lug.
Figure 31:
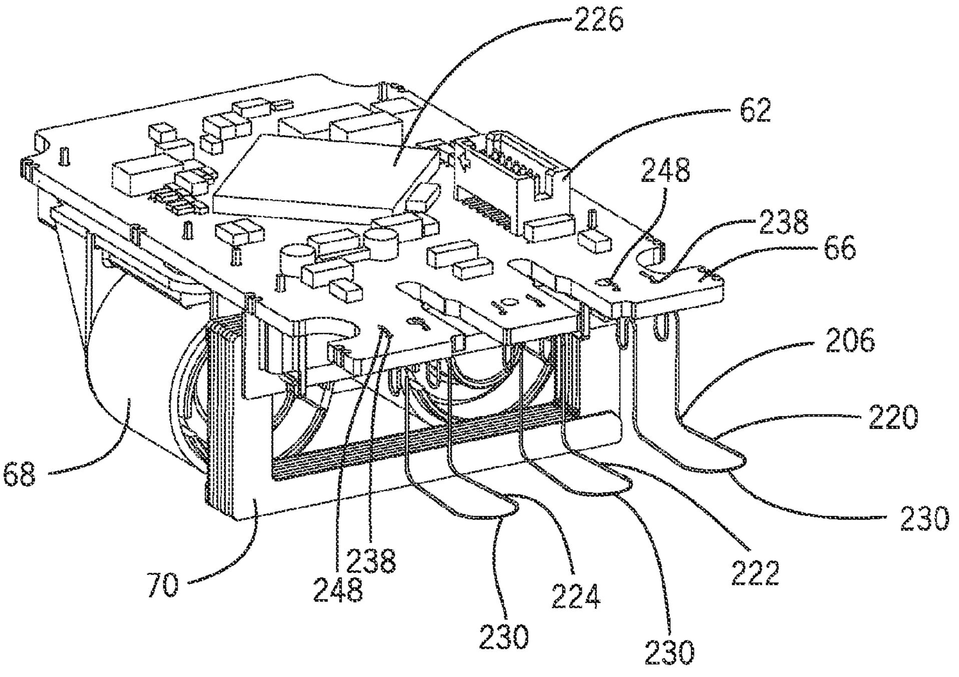
FIG. 31 is a perspective view of the sensing module circuit board with three voltage sensor contacts coupled to the circuit board, one for each phase.

Referring to FIGS. 28-30, the electrical conductor 220 can be electrically coupled to both the sensing module circuit board 66 and the phase conductor 214 to provide a voltage to a processor 226 on the sensing module circuit board 66, or alternatively to the processor 94 on the controller module circuit board 92. It is to be appreciated that the sensed voltage can be conditioned prior to being provided to an A/D converter (not shown) and/or the processor 226 or 94. It is also to be appreciated that processor 94 and/or processor 226 can serve to implement the voltage measurement and power calculation capabilities, and to analyze sensed data to determine when a condition exists that may warrant opening of one or more overload relay contacts. In the three phase embodiment shown, three electrical conductors 220, 222, 224 are included (see FIG. 27), one for each phase, and each electrical conductor can be electrically coupled to an individual phase conductor 214, 216, 218 respectively (see FIGS. 27 and 31). Only a single electrical conductor is needed per phase to create the required electric connection 212.

The electrical conductor 220 can be electrically coupled to the sensing module circuit board 66 with one or more through-holes 238 using standard surface mount reflow processes (pin-in-paste) or wave-soldering processes. Most surface mount components sit on the surface of a circuit board, typically with no plated-through holes. The surface mount technology process is well known. The process can be extended to effectively solder through-hole parts by correct sizing of the plated through-hole with respect to the pin, the size of the pad around the hole, and the correct amount of paste stenciled onto and around the pad. Pin-in-paste joints typically "over-paste," where the paste area is larger than the pad around the hole to provide extra solder to make a joint in to the pin in the barrel. Molten solder will wet to the metal areas, such as pad, through-hole barrel, and component pin, and get pulled from the non-metal areas around the pad. Many things can go wrong with this process. For example, a connector with a plastic body feature that touches the circuit board surface too close to the pad will interfere with the paste and impede flow of solder into the joint or cause the extra solder to ball up instead of flow.

The method of coupling the electrical conductor 220 to the sensing module circuit board 66 solves a variety of possible mounting issues. A through-hole 238 for the electrical conductor 220 can provide an optimum solder joint strength. Use of a surface mount technology process can provide compatibility with other components on the sensing module circuit board 66, which helps to avoid added assembly costs. The electrical conductor 220 has a center of gravity located away from the through-hole 238, so it can be configured to utilize features that support it in the correct position before and during formation of the solder joint. In order to support the electrical conductor 220 during the mounting process, the electrical conductor 220 can include at least one U-bend 236 to be positioned on a side 240 of the sensing module circuit board 66 (see FIGS. 30 and 32) to provide support without additional fixturing, while maintaining an optimal wire-sticking-straight-out-of-hole 238 orientation so the solder collects in the barrel 248 with the electrical conductor 220. The electrical conductor can also include a generally ninety degree bend 258 near ends 210 to provide further support during formation of the solder joint.

During assembly of the sensing module 30, a contact portion 230 of the electrical conductor 220 can be positioned within one of the load side terminals 60, such as a box lug 232 of the sensing module 30, eliminating the need for any final assembly operation or components. The compliant electrical conductor 220 also can provide a robust final assembly fit and allowance for tolerance stackup within the interior 46 of the sensing module. A user's action of tightening the box lug 232 to a load wire 234 (see FIGS. 28 and 30) can create a low resistance and reliable electrical connection between the electrical conductor 220 and the phase conductor 214. The consistency of the electrical connection can help to maintain a consistent accuracy of the voltage measurement.

The electrical conductor 220 design and material selection can provide inherent resilience. The electrical conductors 220, 222, 224 can help to isolate contactor 54 shock and vibration experienced by the phase conductors 214, 216, 218 from electrical conductor solder joints 238, the sensing module circuit board 66, and electrical components (e.g., processor 226).

The electrical conductor 220 can provide the electrical connection 212 function and required voltage creepage and clearance requirements while at the same time requiring little or no additional sensing module 30 volume or sensing module circuit board 66 space.

Referring to FIGS. 34-38, in some embodiments, the overload relay assembly 20 can include a preformed coil interface 250 including jumper wiring 252. The preformed coil interface 250 can reduce a user's wiring time and labor to connect predetermined output terminals 254 of the overload relay assembly 20 to predetermined contactor coil terminals 256 on the contactor 54.

Figure 36:
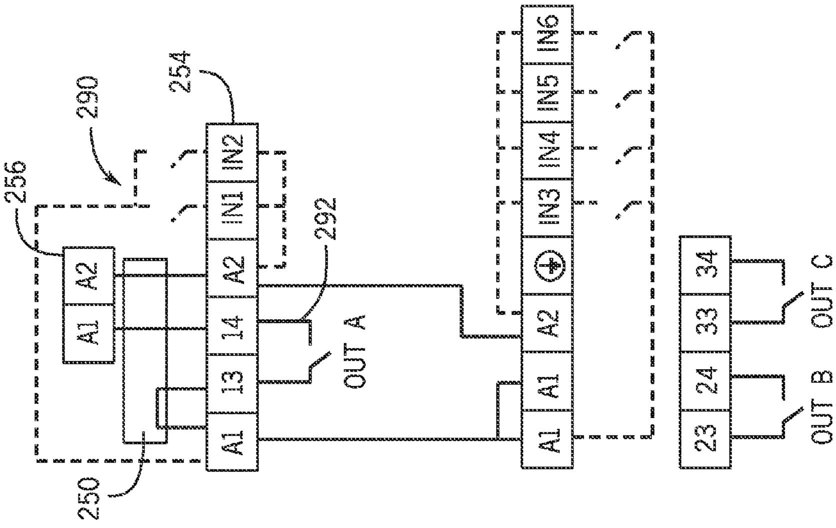
FIG. 36 is a schematic diagram of the preformed coil interface coupled to the modular overload relay assembly and a contactor.

The preformed coil interface 250 can eliminate cutting and stripping wires for electrically connecting the output terminals 254 of the overload relay assembly 20 to the contactor coil terminals 256 on the contactor 54 to complete a control circuit 290 (see FIG. 36). In addition, the preformed coil interface 250 can be preformed in a plurality of configurations to automatically and correctly electrically connect the output terminals 254 of the overload relay assembly 20 to the contactor coil terminals 256, thereby eliminating the possibility of incorrect control wiring.

Jumper wiring 252 of the preformed coil interface 250 can be aligned by a molded insulator 260, and when secured to either of the output terminals 254 of the overload relay assembly 20 or the contactor coil terminals 256, the preformed coil interface 250 can automatically align with and facilitates the correct connection to the other of the output terminals 254 of the overload relay assembly 20 or the contactor coil terminals 256.

The preformed coil interface 250 can be configured to avoid interference with the integrated phase current conductors 50 used to electrically couple the load wiring from the overload relay assembly 20 to the contactor 54. It is to be appreciated that the preformed coil interface 250 can be configured for use with non-reversing contactor configurations, reversing contactor configurations, multi-speed contactor configurations, and any other contactor configuration, and can be used with single pole, two pole, three pole, and multi-pole contactor configurations. Use of the preformed coil interface 250 with the integrated phase current conductors 50 can provide a contactor direct connection method where all control wiring and power wiring between the overload relay assembly 20 and the contactor 54 can be provided with the overload relay assembly 20. The preformed coil interface 250 and preformed integrated phase current conductors 50 allows a user to simply slide the overload relay assembly 20 to the contactor 54, thereby automatically inserting the preformed coil interface 250 jumper wiring 252 and the integrated phase current conductors 50 into respective control terminals and power terminals on the contactor 54. In some embodiments, the user can then secure the preformed coil interface 250 jumper wiring 252 and the integrated phase current conductors 50 within the respective control terminals and power terminals on the contactor 54 and/or the modular overload relay assembly 20. In other embodiments, the preformed coil interface 250 jumper wiring 252 and the integrated phase current conductors 50 can be automatically secured using spring force terminals, for example.

Figure 38:
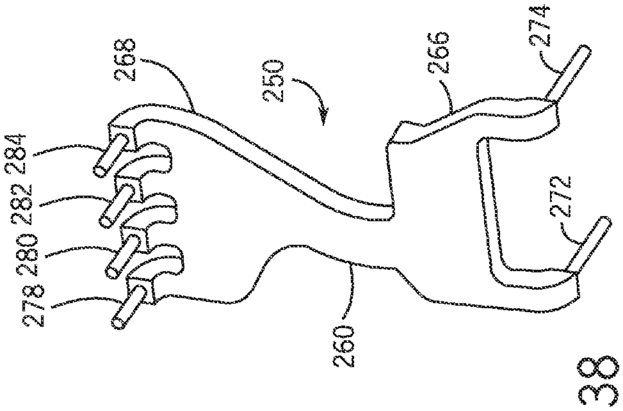
FIGS. 37 and 38 are views of the preformed coil interface, showing internal wiring and a molded insulator.
Figure 37:
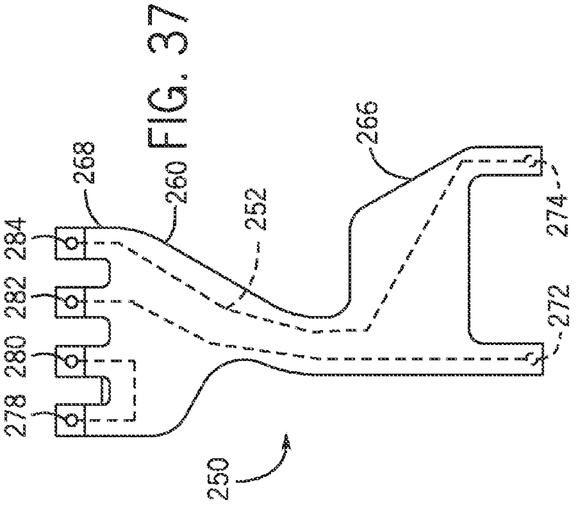

Referring to FIGS. 37 and 38, in some embodiments, the preformed coil interface 250 can include a contactor coil terminal end 266 and an overload relay output terminal end 268. The contactor coil terminal end 266 can include two jumper wiring connection points 272 and 274, although one and more than two are contemplated. The overload relay output terminal end 268 can include four jumper wiring connection points 278, 280, 282, and 284, although less than and more than four are contemplated. As can be seen, connection point 272 can extend through the preformed coil interface 250 to connection point 282 at the overload relay output terminal end 268. Similarly, connection point 274 can extend through the preformed coil interface 250 to connection point 284 at the overload relay output terminal end 268. Connection points 278 and 280 can be jumpered internal to the preformed coil interface 250.

Jumper wiring connection points 272 and 274 can extend outward substantially at a 90 degree angle from the contactor coil terminal end 266, and the four jumper wiring connection points 278, 280, 282, and 284 can extend outward substantially at a 90 degree angle from the overload relay output terminal end 268 and in a substantially opposite direction to the jmper wiring connection points 272 and 274.

In this configuration, the preformed coil interface 250 serves to complete the control circuit 290 where control power, indicated as A1 and A2 in FIG. 36, can be wired in series through an overload relay contact 292 and to the contactor coil terminals 256. In operation, when the modular overload relay assembly 20 trips due to a sensed condition, contact 292 opens and removes control power from the contactor coil terminals 256, thereby interrupting power to a motor, in a manner well understood to those skilled in the art.

It is to be appreciated that the preformed coil interface 250 can include other wiring configurations capable of providing other control circuit functionality and able to operate with additional contacts (not shown) on either or both the overload relay assembly 20 and the contactor 54. The contact 292 may be realized with solid-state elements such as transistors and need not be any particular form of contact, as is understood in the art.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Finally, it is expressly contemplated that any of the processes or steps described herein may be combined, eliminated, or reordered. Accordingly, this description is meant to be taken only by way of example, and not to otherwise limit the scope of this invention.

We claim:

1. A system for electrically coupling modular electrical devices, the system comprising:

a first modular electronic device to mechanically couple to a second modular electronic device, the first modular electronic device including a first housing and a first circuit board within the first housing, the first circuit board including a first electrical connector electrically coupled to the circuit board;

the second modular electronic device including a second housing and a second circuit board and a flexible circuit element within the second housing, the second circuit board electrically coupled to the flexible circuit element, the second housing including a latch plate adjustable between an unlatched position and a latched position, the latch plate including a biasing member;

the flexible circuit element being electrically coupled to a second electrical connector, the second electrical connector to electrically mate with the first electrical connector; and a connector carrier coupled to second electrical connector, the connector carrier including a cam, the cam to engage the biasing member when the latch plate is adjusted between the unlatched position and the latched position, such that, when the first modular electronic device is pressed together with the second modular electronic device, the biasing member applies a force to the cam during a latch plate transition position to ensure that the second electrical connector has fully mated with the first electrical connector, wherein the force applied by the biasing member is in a direction transverse to the motion of the latch plate when the latch plate is adjusted between the unlatched position and the latched position.

2. The system according to claim 1, wherein during the latch plate transition position, a first gap exists between the connector carrier and the second housing to allow the second electrical connector coupled to the connector carrier to move in a Z direction to ensure that the second electrical connector has fully mated with the first electrical connector.

3. The system according to claim 1, wherein the latch plate further includes a latch plate unlatched position, and during the latch plate unlatched position, the contact carrier is physically held against the second housing by the biasing member.

4. The system according to claim 1, wherein the latch plate further includes a latch plate latched position, and during the latch plate latched position, a first gap exists between the connector carrier and the second housing.

5. The system according to claim 1, wherein during the latch plate latched position, a second gap exists between the connector carrier and the biasing member, the first gap and the second gap allowing the second electrical connector to be mechanically coupled to the second electronic device only through the flexible circuit element.

6. The system according to claim 1, wherein the first modular electronic device comprises a sensing module, the sensing module to sense a current passing through the second housing.

7. The system according to claim 6, wherein the second modular electronic device comprises a controller module, the second circuit board with the second housing to control at least a portion of an operation of the sensing module.

8. The system according to claim 1, further including the first modular electronic device mechanically and electrically coupled to the second modular electronic device to produce a modular overload relay.

9. The system according to claim 1, further including a third modular electronic device, the third modular electronic device to mechanically couple to the second modular electronic device, the a third modular electronic device comprising a communication module.

10. A mating connector assembly for electrically coupling modular electrical devices, the assembly comprising:

a first stationary connector, a first floating connector, and a second floating connector;

the first stationary connector coupled to a first rigid circuit board positioned within a first housing of a first modular electrical device;

the first floating connector coupled to a flexible circuit element positioned within a second housing of a second modular electrical device, the flexible circuit element coupled to a second rigid circuit board positioned within a second housing of a second modular electrical device;

the second floating connector coupled to the flexible circuit element positioned within the second housing of the second modular electrical device; and the second housing including a first latch plate adjustable between an unlatched position and a latched position, the first latch plate including a biasing member, such that, when the first modular electronic device is pressed together with the second modular electronic device, the biasing member applies a force to the first floating connector during a latch plate transition position to ensure that the first floating connector has fully mated with the first stationary connector and wherein the motion of the first latch plate is in an opposite direction of the motion of the second latch plate when the first latch plate and the second latch plate are adjusted between the unlatched position and the latched position.

11. The assembly according to claim 10, further including a second stationary connector;

the second stationary connector coupled to a third rigid circuit board, the second stationary connector and the third rigid circuit board positioned within a third housing of a third modular electrical device;

the second housing including second latch plate adjustable between an unlatched position and a latched position, the second latch plate including a second latch plate biasing member, such that, when the third modular electronic device is pressed together with the second modular electronic device, the second latch plate biasing member applies a force to the second floating connector during a second latch plate transition position to ensure that the second floating connector has fully mated with the second stationary connector.

12. The assembly according to claim 10, wherein the first modular electronic device comprises a sensing module, the sensing module to sense a current passing through the first housing.

13. The assembly according to claim 12, wherein the second modular electronic device comprises a controller module, the circuit board with the second housing to control at least a portion of an operation of the sensing module.

14. The assembly according to claim 12, wherein the third modular electronic device comprises a communication module.

15. The assembly according to claim 11, wherein the first floating connector couples to the first stationary connector through a first side of the second modular electrical device and the second floating connector couples to the second stationary connector through a second side of the second modular electrical device.

16. The assembly according to claim 15, wherein the first side of the second modular electrical device is opposed to the second side of the second modular electrical device.

17. The system according to claim 1, the second modular electronic device further includes a third electrical connector electrically coupled to the flexible circuit element within the second housing and the second housing further including a second latch plate adjustable between a unlatched position and a latched position, the second latch plate including a second biasing member;

a third modular electronic device to mechanically couple to the second modular electronic device, the third modular electronic device including a third housing and a third circuit board within the third housing, the third circuit board including a fourth electrical connector electrically coupled to the third circuit board;

the third electrical connector to electrically mate with the fourth electrical connector; and a second connector carrier coupled to the third electrical connector, the second connector carrier including a second cam, the second cam to engage the second biasing member when the second latch plate is adjusted between the unlatched position and the latched position, such that, when the third modular electronic device is pressed together with the second modular electronic device, the second biasing member applies a force to the second cam during a second latch plate transition position to ensure that the third electrical connector has fully mated with the fourth electrical connector, wherein the force applied by the second biasing member is in a direction transverse to the motion of the second latch plate when the second latch plate is adjusted between the unlatched position and the latched position.

18. The system according to claim 17, wherein the first modular electronic device is pressed together with the second modular electronic device on a first side of the second modular electronic device and the third modular electronic device is pressed together with the second modular electronic device on a second side of the second modular electronic device.

19. A mating connector assembly for electrically coupling modular electrical devices, the assembly comprising:

a first stationary connector, a first floating connector, and a second floating connector;

the first stationary connector coupled to a first rigid circuit board positioned within a first housing of a first modular electrical device;

the first floating connector coupled to a flexible circuit element positioned within a second housing of a second modular electrical device, the flexible circuit element coupled to a second rigid circuit board positioned within a second housing of a second modular electrical device;

the second floating connector coupled to the flexible circuit element positioned within the second housing of the second modular electrical device; and the second housing including a first latch plate adjustable between an unlatched position and a latched position, the first latch plate including a biasing member, such that, when the first modular electronic device is pressed together with the second modular electronic device, the biasing member applies a force to the first floating connector during a latch plate transition position to ensure that the first floating connector has fully mated with the first stationary connector, and wherein the first floating connector couples to the first stationary connector through a first side of the second modular electrical device and the second floating connector couples to a second stationary connector through a second side of the second modular electrical device.

* * * * *